(12) United States Patent
Okabe et al.

(10) Patent No.: US 12,510,982 B2
(45) Date of Patent: Dec. 30, 2025

(54) DISPLAY DEVICE

(71) Applicant: SHARP KABUSHIKI KAISHA, Sakai (JP)

(72) Inventors: Tohru Okabe, Sakai (JP); Shoji Okazaki, Sakai (JP); Shinsuke Saida, Sakai (JP); Shinji Ichikawa, Sakai (JP); Hiroki Taniyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 406 days.

(21) Appl. No.: 18/038,507

(22) PCT Filed: Nov. 30, 2020

(86) PCT No.: PCT/JP2020/044465
§ 371 (c)(1),
(2) Date: May 24, 2023

(87) PCT Pub. No.: WO2022/113333
PCT Pub. Date: Jun. 2, 2022

(65) Prior Publication Data
US 2024/0023384 A1    Jan. 18, 2024

(51) Int. Cl.
| | | |
|---|---|---|
| *H10K 59/131* | (2023.01) | |
| *G06F 3/041* | (2006.01) | |
| *H10K 50/00* | (2023.01) | |
| *H10K 50/844* | (2023.01) | |
| *H10K 59/00* | (2023.01) | |
| *H10K 59/124* | (2023.01) | |

(Continued)

(52) U.S. Cl.
CPC ........... *G06F 3/0412* (2013.01); *H10K 50/00* (2023.02); *H10K 50/844* (2023.02); *H10K 59/00* (2023.02); *H10K 59/124* (2023.02); *H10K 59/131* (2023.02); *H10K 59/40* (2023.02); *H10K 59/8731* (2023.02); *H10K 77/111* (2023.02)

(58) Field of Classification Search
None
See application file for complete search history.

(56) References Cited

U.S. PATENT DOCUMENTS

| | | |
|---|---|---|
| RE49,052 E | 4/2022 | Youn et al. |
| 2014/0353670 A1 | 12/2014 | Youn et al. |

(Continued)

FOREIGN PATENT DOCUMENTS

JP    2014232300 A    12/2014

*Primary Examiner* — Kyoung Lee
(74) *Attorney, Agent, or Firm* — ScienBiziP, P.C.

(57) ABSTRACT

A first planarization film is provided to opposing sides out of a folding portion to: fill widthwise opposing end portions of a slit; and expose a surface of a resin substrate layer in an intermediate position between the widthwise opposing end portions. In the folding portion and at the opposing sides out of the folding portion, a plurality of routed wires are provided on the first planarization film and the resin substrate layer, and extending in parallel with one another in a direction perpendicular to a direction in which the folding portion extends. The plurality of routed wires are each electrically connected to a corresponding one of a plurality of display wires toward a display region and to a corresponding one of a plurality of terminals toward a terminal unit. The plurality of routed wires are formed of a same material as, and in a same layer as, a wiring layer is.

20 Claims, 14 Drawing Sheets

(51) Int. Cl.
  *H10K 59/40*   (2023.01)
  *H10K 59/80*   (2023.01)
  *H10K 77/10*   (2023.01)

(56) References Cited

U.S. PATENT DOCUMENTS

2015/0287750 A1     10/2015  Youn et al.
2019/0041915 A1 *    2/2019  Park .................. H10D 86/60

* cited by examiner

DISPLAY DEVICE

TECHNICAL FIELD

The disclosure relates to a display device.

BACKGROUND ART

In recent years, light-emitting organic electroluminescence (EL) display devices using organic EL elements have attracted attention as a replacement for liquid crystal display devices. These organic EL display devices include flexible organic EL display devices. A proposed flexible display device has organic EL elements formed on a flexible resin substrate layer. Here, in an organic EL display device, a picture-frame region is provided around a display region that displays an image, and the organic EL display device is desired to have the picture-frame region reduced; that is, to have a narrow picture-frame region. The flexible organic EL display device has a problem: that is, when the picture-frame region is bent to reduce an area occupied by the picture-frame region in plan view, the wires arranged in the picture-frame region might be broken.

For example, Patent Document 1 discloses a flexible display device in which a bending hole is formed to partially remove each of a buffer film, a gate insulating film, and an interlayer insulating film corresponding to the bending region, thereby preventing the wires from breaking.

CITATION LIST

Patent Document

[Patent Document 1] Japanese Unexamined Patent Application Publication No. 2014-232300

SUMMARY

Technical Problem

The flexible organic EL display device includes inorganic insulating films such as a base coat film, a gate insulating film, and an interlayer insulating, all of which are provided above a resin substrate layer. Hence, in order to reduce the risk of breaking a plurality of routed wires arranged in the picture-frame region, a structure is proposed to: remove a portion of the inorganic insulating film from a bent portion (a folding portion) of the picture-frame region; fill, with a planarization film, the portion from which the inorganic insulating film is removed; and form routed wires on the planarization film. However, even though the inorganic insulating film is removed from the folding portion, the portion from which the inorganic insulating film is removed is filled with the planarization film, and the routed wires are formed on the planarization film, if the organic EL display device is folded in the folding portion at 180° with a curvature radius of approximately 0.3 to 1.0 mm, for example, the planarization film might be cracked, and the routed wires on the planarization film might be broken.

The disclosure is conceived in view of the above problem, and intended to reduce the risks of cracks to be formed on the planarization film and breaks of the routed wires in the folding portion.

Solution to Problem

In order to achieve the above object, a display device according to the disclosure includes: a resin substrate layer; a thin-film transistor layer provided on the resin substrate layer, and including an inorganic insulating film, a first planarization film, a wiring layer, and a second planarization film stacked on top of another in a stated order; and a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region. The display region is surrounded with a picture-frame region. The picture-frame region has an end portion provided with a terminal unit. Between the display region and the terminal unit, a folding portion is provided to extend in one direction. The display region is provided with a plurality of display wires extending in parallel with one another The terminal unit includes a plurality of terminals extending in a direction in which the folding portion extends. The inorganic insulating film includes a slit provided in the folding portion, extending in the direction in which the folding portion extends, and exposing a surface of the resin substrate layer. The first planarization film is provided to opposing sides out of the folding portion to: fill widthwise opposing end portions of the slit; and expose the surface of the resin substrate layer in an intermediate position between the widthwise opposing end portions. In the folding portion and at the opposing sides out of the folding portion, a plurality of routed wires are provided on the first planarization film and the resin substrate layer, and extending in parallel with one another in a direction perpendicular to the direction in which the folding portion extends. The plurality of routed wires are each electrically connected to a corresponding one of the plurality of display wires toward the display region and to a corresponding one of the plurality of terminals toward the terminal unit. The plurality of routed wires are formed of a same material as, and in a same layer as, the wiring layer is.

Moreover, a display device according to the disclosure includes: a resin substrate layer; a thin-film transistor layer provided on the resin substrate layer, and including an inorganic insulating film, a wiring layer, and a planarization film stacked on top of another in a stated order; a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region; a sealing film provided to cover the light-emitting element layer, and including a first inorganic sealing film, an organic sealing film, and a second inorganic sealing film stacked on top of another in a stated order; and a touch panel layer provided on the sealing film, and including a first touch wiring layer, an interlayer insulating film, a second touch wiring layer stacked on top of another in a stated order. The display region is surrounded with a picture-frame region. The picture-frame region has an end portion provided with a terminal unit. Between the display region and the terminal unit, a folding portion is provided to extend in one direction. The display region is provided with a plurality of display wires extending in parallel with one another. The terminal unit includes a plurality of terminals extending in a direction in which the folding portion extends. The inorganic insulating film includes a slit provided in the folding portion, extending in the direction in which the folding portion extends, and exposing a surface of the resin substrate layer. The planarization film is provided to opposing sides out of the folding portion to: fill widthwise opposing end portions of the slit; and expose the surface of the resin substrate layer in an intermediate position between the widthwise opposing end portions. In the folding portion and at the opposing sides out of the folding portion, a plurality of routed wires are provided on the planarization film and the resin substrate layer, and extending in parallel with one another in a direction perpendicular to the direction in which the folding portion extends. The plurality of routed wires are each electrically connected to a corresponding one of the plurality of display wires toward the display region and to a corresponding one of the plurality of terminals toward the terminal unit. The plurality of routed wires are formed of a same material as, and in a same layer as, either the first touch wiring layer or the second touch wiring layer is.

Furthermore, a display device according to the disclosure includes: a resin substrate layer; a thin-film transistor layer provided on the resin substrate layer, and including an inorganic insulating film, a wiring layer, and a planarization film stacked on top of another in a stated order; and a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region. The display region is surrounded with a picture-frame region. The picture-frame region has an end portion provided with a terminal unit. Between the display region and the terminal unit, a folding portion is provided to extend in one direction. The display region is provided with a plurality of display wires extending in parallel with one another. The terminal unit includes a plurality of terminals extending in a direction in which the folding portion extends. The inorganic insulating film includes a slit provided in the folding portion, extending in the direction in which the folding portion extends, and exposing a surface of the resin substrate layer. An other planarization film is provided to opposing sides out of the folding portion to: fill widthwise opposing end portions of the slit; and expose the surface of the resin substrate layer in an intermediate position between the widthwise opposing end portions. In the folding portion and at the opposing sides out of the folding portion, a plurality of routed wires are provided on the other planarization film and the resin substrate layer, and extending in parallel with one another in a direction perpendicular to the direction in which the folding portion extends. The plurality of routed wires are each electrically connected to a corresponding one of the plurality of display wires toward the display region and to a corresponding one of the plurality of terminals toward the terminal unit. The plurality of routed wires are formed of a same material as, and in a same layer as, the wiring layer is.

Advantageous Effects

The disclosure can reduce the risks of cracks to be formed on a planarization film and breaks of routed wires in a folding portion.

BRIEF DESCRIPTION OF DRAWINGS

FIG. 9 corresponds to FIG. 7.

FIG. 10 corresponds to FIG. 8.

FIG. 11 corresponds to FIG. 7.

FIG. 12 corresponds to FIG. 3.

FIG. 13 corresponds to FIG. 7.

FIG. 14 corresponds to FIG. 7.

FIG. 15 corresponds to FIG. 3.

FIG. 16 corresponds to FIG. 7.

FIG. 17 corresponds to FIG. 3.

FIG. 18 corresponds to FIG. 7.

FIG. 19 corresponds to FIG. 7.

DESCRIPTION OF EMBODIMENTS

Embodiments of the disclosure will be described in detail below with reference to the drawings. Note that the disclosure shall not be limited to the embodiments below.

First Embodiment

Figure 1:
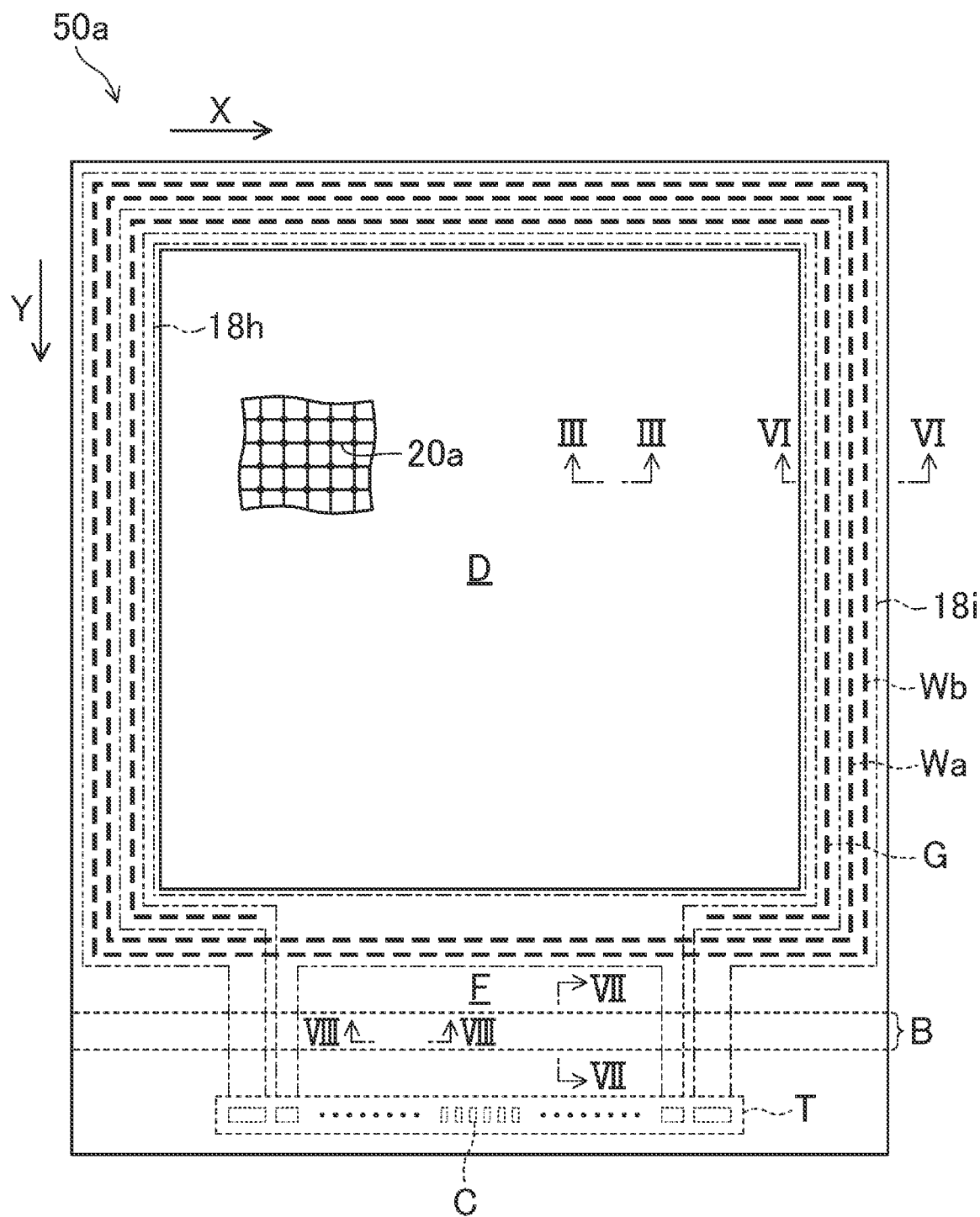
FIG. 1 is a plan view of a schematic configuration of an organic EL display device according to a first embodiment of the disclosure.
Figure 2:
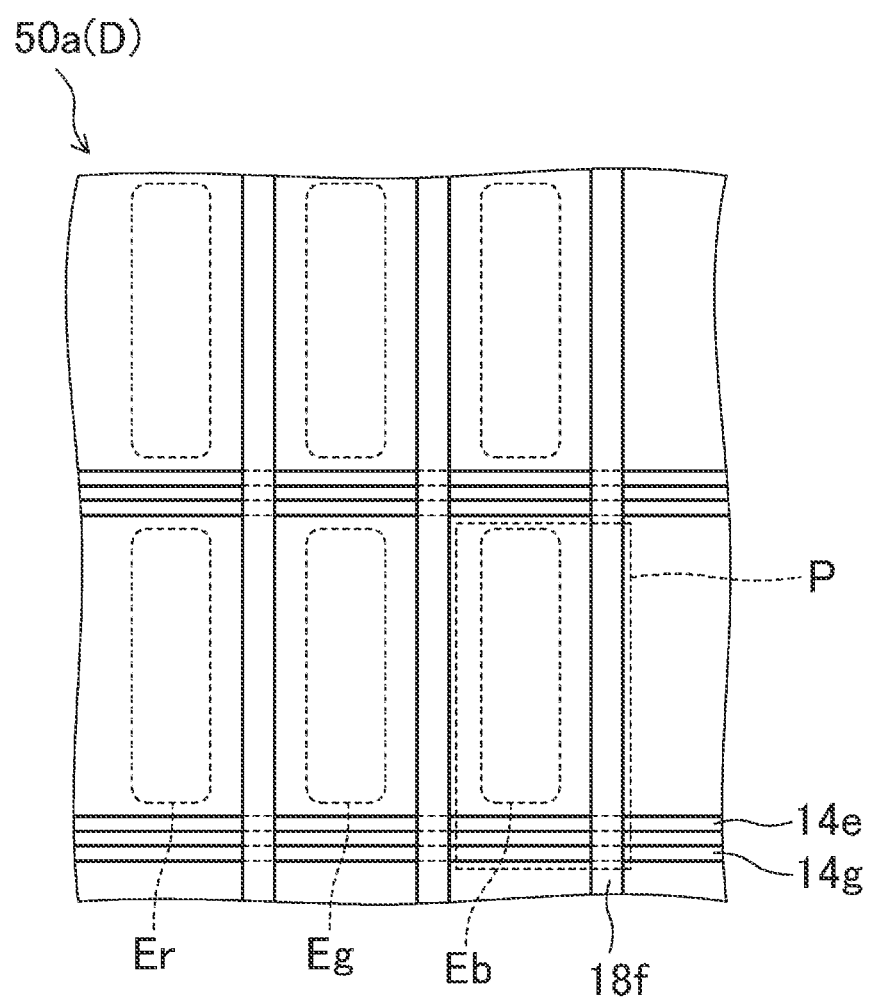
FIG. 2 is a plan view of a display region of the organic EL display device according to the first embodiment of the disclosure.
Figure 3:
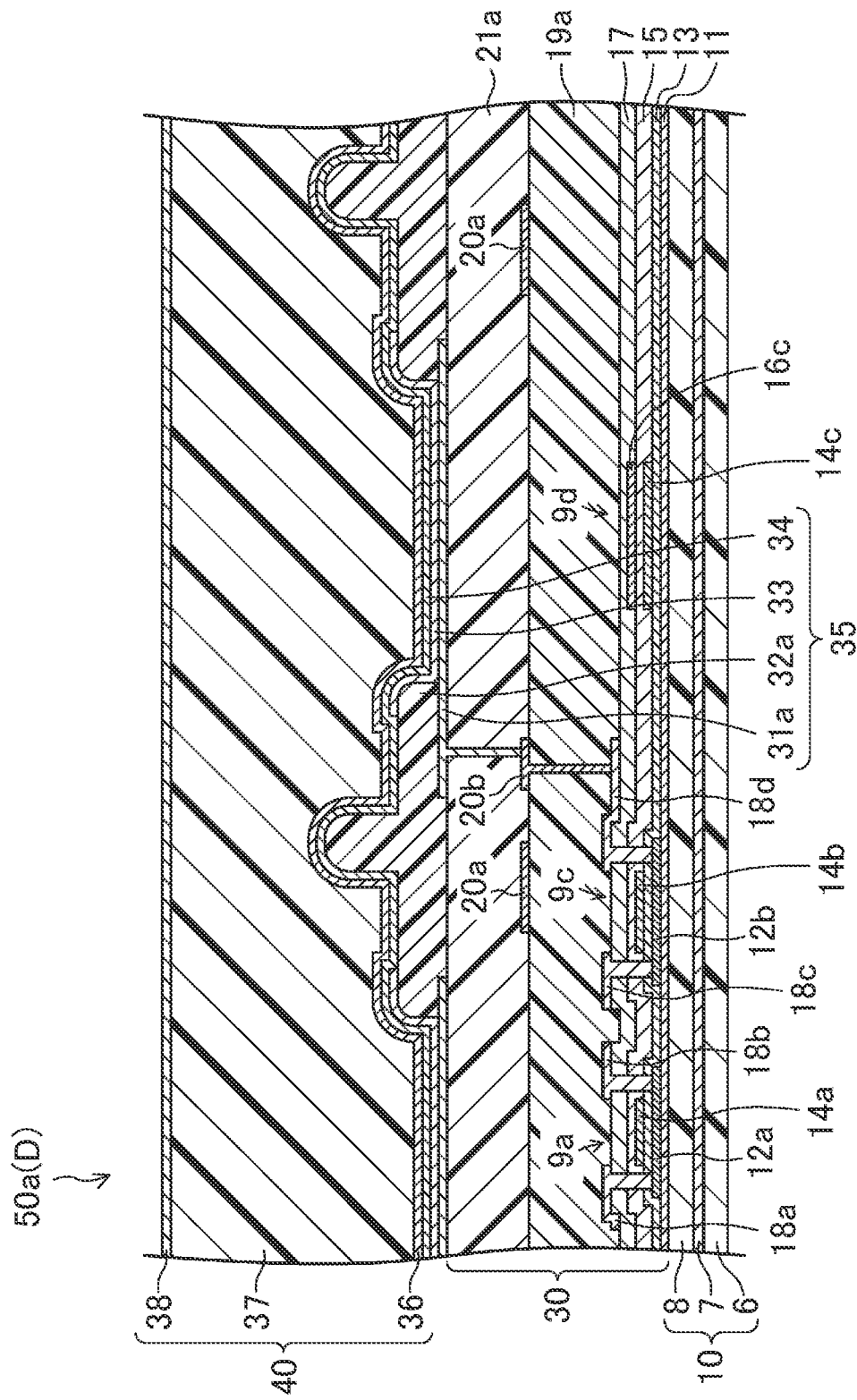
FIG. 3 is a cross-sectional view of the display region of the organic EL display device, taken along line III-III in FIG. 1.
Figure 4:
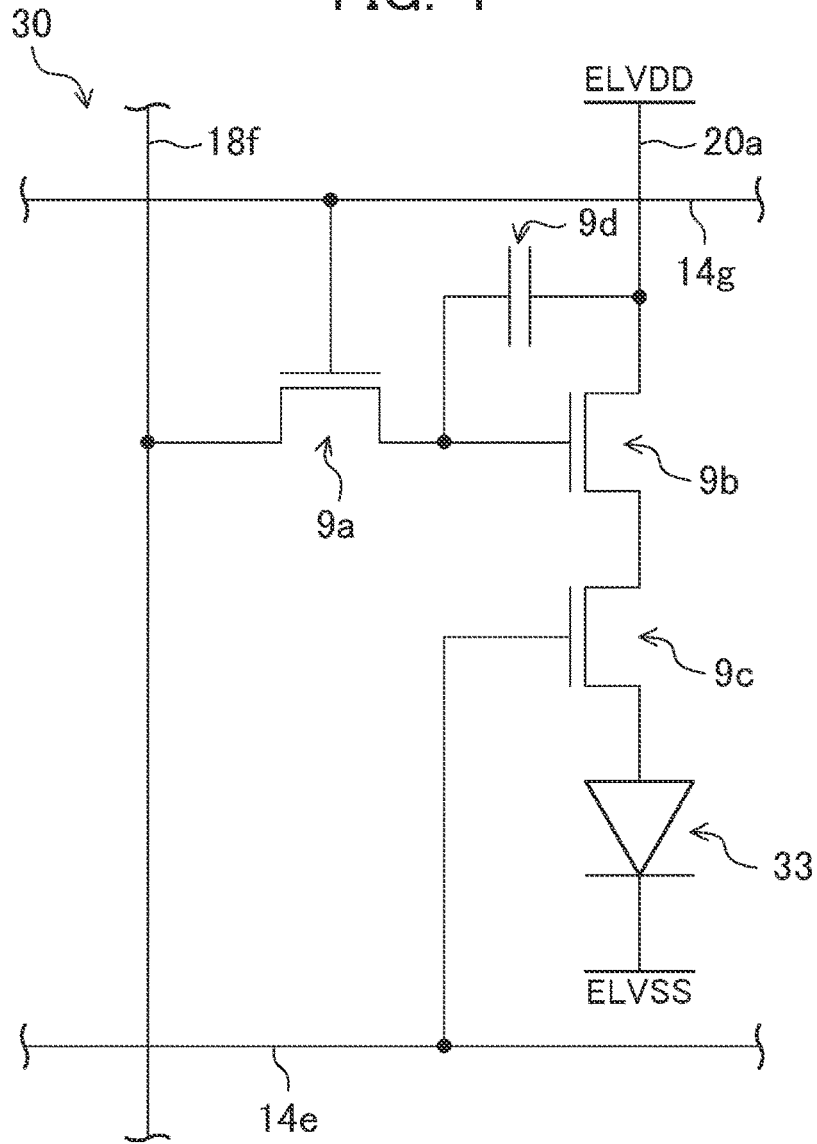
FIG. 4 is an equivalent circuit diagram of a thin-film transistor layer included in the organic EL display device according to the first embodiment of the disclosure.
Figure 5:
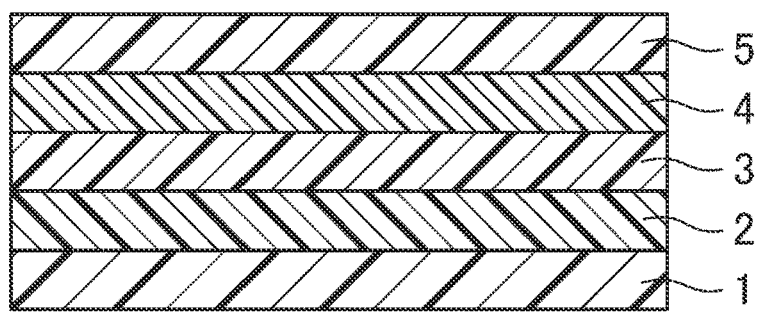
FIG. 5 is a cross-sectional view of an organic EL layer included in the organic EL display device according to the first embodiment of the disclosure.
Figure 6:
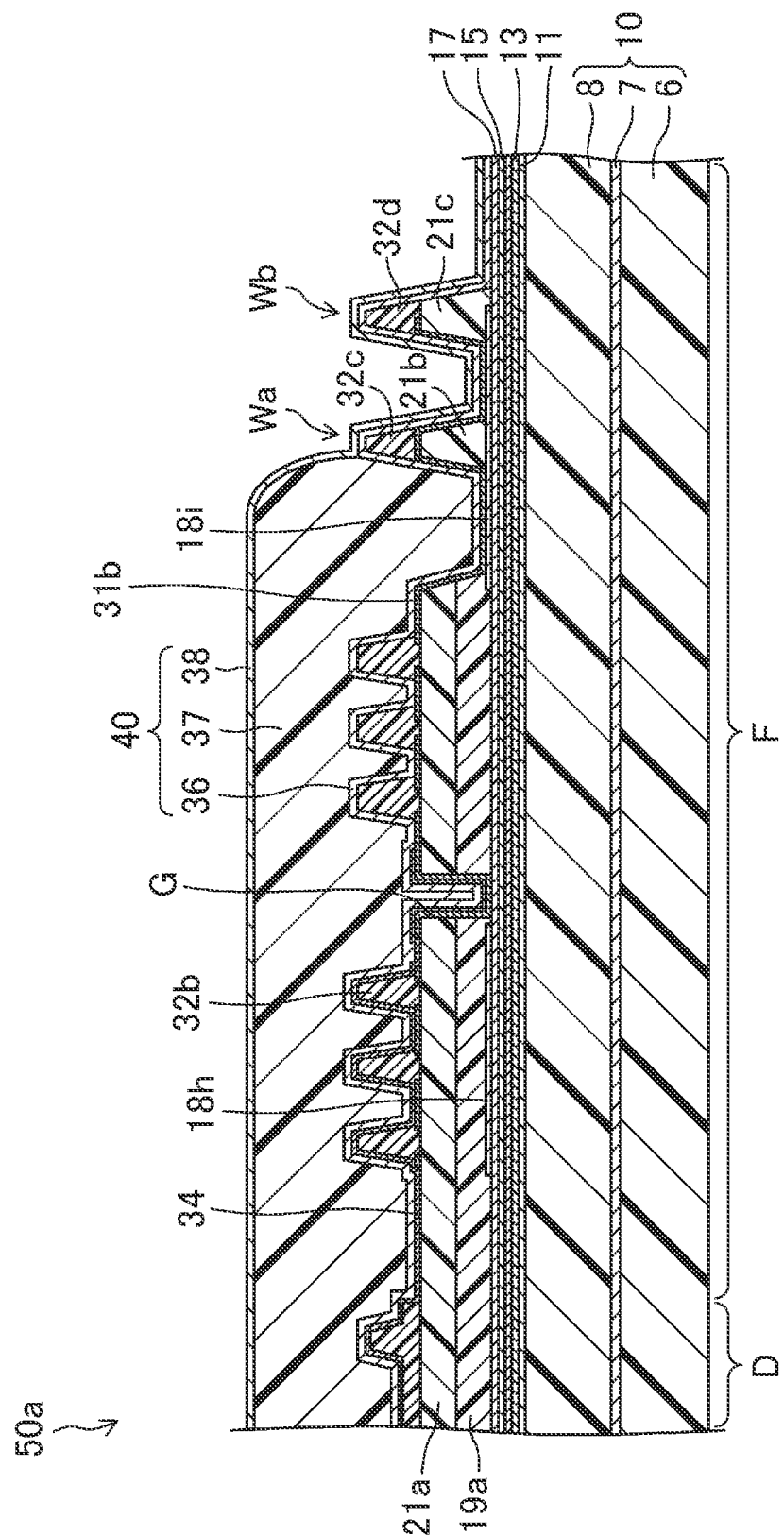
FIG. 6 is a cross-sectional view of the organic EL display device, taken along line VI-VI in FIG. 1.
Figure 7:
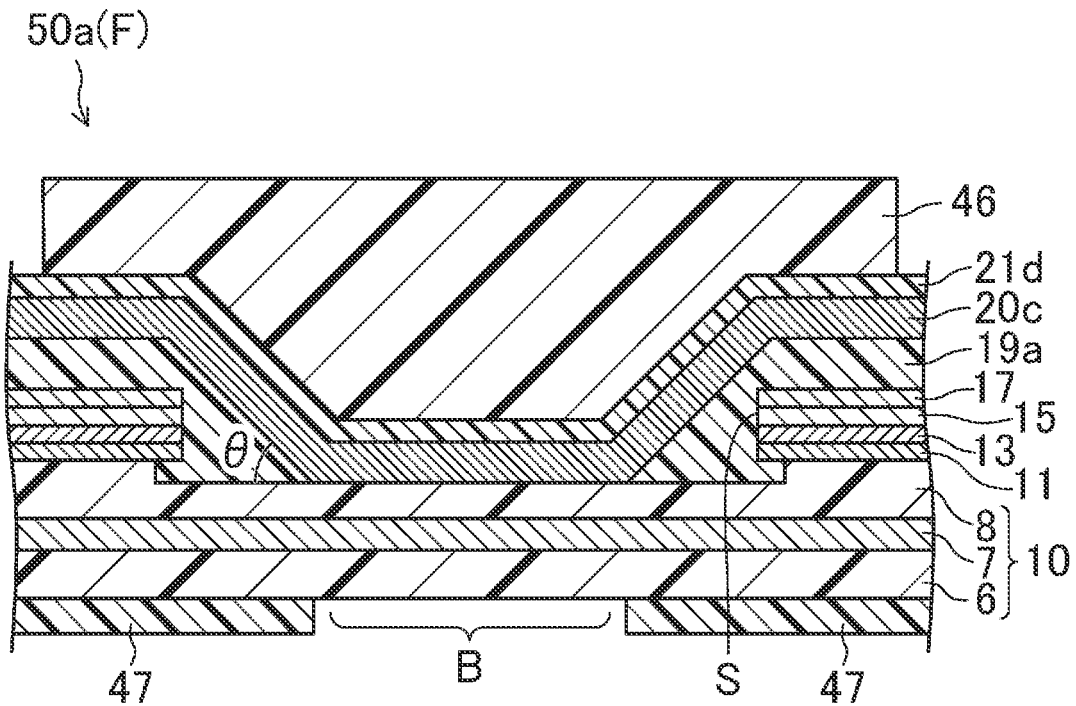
FIG. 7 is a cross-sectional view of a picture-frame region of the organic EL display device, taken along line VII-VII in FIG. 1.
Figure 8:
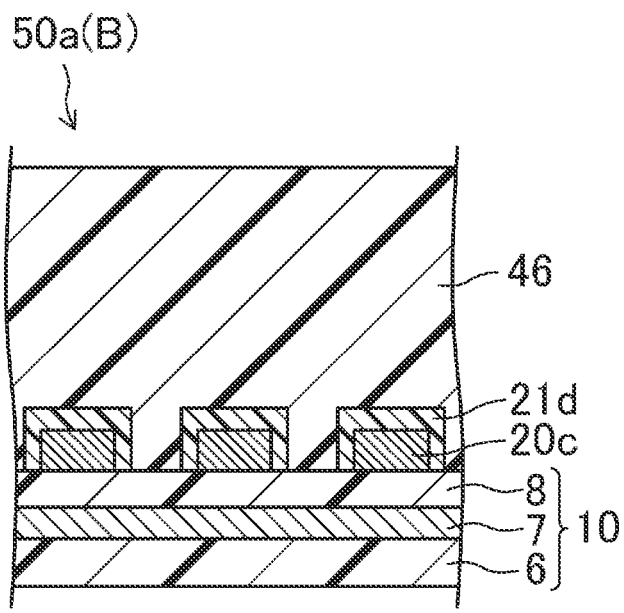
FIG. 8 is a cross-sectional view of a folding portion of the organic EL display device, taken along line VIII-VIII in FIG. 1.

FIGS. 1 to 8 illustrate a first embodiment of a display device according to the disclosure. In the embodiments below, an organic EL display device including an organic EL element is exemplified as a display device including a light-emitting element. Here, FIG. 1 is a plan view of a schematic configuration of an organic EL display device 50*a* according to this embodiment. FIG. 2 is a plan view of a display region D of the organic EL display device 50*a*. FIG. 3 is a cross-sectional view of the display region D of the organic EL display device 50*a*, taken along line III-III in FIG. 1. FIG. 4 is an equivalent circuit diagram of a thin-film transistor layer 30 included in the organic EL display device 50*a*. FIG. 5 is a cross-sectional view of an organic EL layer 33 included in the organic EL display device 50*a*. FIG. 6 is a cross-sectional view of the organic EL display device 50*a*, taken along line VI-VI in FIG. 1. FIG. 7 is a cross-sectional view of a picture-frame region F of the organic EL display device 50*a*, taken along line VII-VII in FIG. 1. FIG. 8 is a cross-sectional view of a folding portion B of the organic EL display device 50*a*, taken along line VIII-VIII in FIG. 1.

As illustrated in FIG. 1, the organic EL display device 50*a* includes, for example: the display region D shaped into a rectangle and displaying an image; and a picture-frame region F shaped into a picture frame and provided around the display region D. Note that this embodiment exemplifies the display region D shaped into a rectangle. Examples of the rectangle include such substantial rectangles as a rectangle having arc-like sides, a rectangle having rounded corners, and a rectangle having partially notched sides.

The display region D illustrated in FIG. 2 includes a plurality of subpixels P arranged in a matrix. Moreover, in the display region D, as illustrated in FIG. 2, for example, subpixels P having red light-emitting regions Er for presenting red, subpixels P having green light-emitting regions Eg for presenting green, and subpixels P having blue light-emitting regions Eb for presenting blue are provided side by side. Note that, in the display region D, for example, neighboring three subpixels P each having one of a red light-emitting region Er, a green light-emitting region Eg, and a blue light-emitting region Eb constitute one pixel.

The picture-frame region F in FIG. 1 has a lower end portion provided with a terminal unit T extending in one direction (in an X-direction in the drawing). Here, as illustrated in FIG. 1, the terminal unit T includes a plurality of terminals C provided in the X-direction in the drawing. Moreover, as illustrated in FIG. 1, the frame region F includes a folding portion B between the display region D and the terminal unit T. The folding portion B, extending in one direction (in the X-direction in the drawing), is foldable around a folding axis in the X-direction in the drawing at an angle of 180° (foldable in a U-shape) with a curvature radius of, for example, approximately 0.3 to 1.0 mm. Furthermore, in the frame region F, a first planarization film 19*a* and a second planarization film 21*a* to be described later are provided with a trench G shaped into a substantial C-shape and penetrating the first planarization film 19*a* and the second planarization film 21*a* as illustrated in FIGS. 1 and 6. Here, as illustrated in FIG. 1, the trench G is shaped into a substantial C-shape and provided to open toward the terminal unit T in plan view.

The organic EL display device 50*a* illustrated in FIG. 3 includes: a resin substrate layer 10; a thin-film transistor (TFT) layer 30 provided on the resin substrate layer 10; an organic EL element layer 35 provided on the TFT layer 30 as a light-emitting element layer; and a sealing film 40 provided to cover the organic EL element layer 35.

The resin substrate layer 10 illustrated in FIGS. 3, 6, 7, and 8 includes: a first resin substrate layer 6 provided across from the TFT layer 30; a second resin substrate layer 8 provided toward the TFT layer 30; and an intra-substrate inorganic insulating film 7 provided between the first resin substrate layer 6 and the second resin substrate layer 8. Here, the first resin substrate layer 6 and the second resin substrate layer 8 are made of, for example, polyimide resin. Moreover, each of the intra-substrate inorganic insulating film 7 and such films to be described later as a base coat film 11, a gate insulating film 13, a first interlayer insulating film 15, and a second interlayer insulating film 17 is, for example, a monolayer inorganic insulating film made of such a substance as silicon nitride, silicon oxide, or silicon oxide nitride. Alternatively, each film is a multilayer inorganic insulating film made of these substances.

The TFT layer 30 in FIG. 3 includes: the base coat film 11 provided on the resin substrate layer 10; a plurality of first TFTs 9*a*, a plurality of second TFTs 9*b* (see FIG. 4), a plurality of third TFTs 9*c*, and a plurality of capacitors 9*d*, all of which are provided on the base coat film 11; and the first planarization film 19*a* and the second planarization film 21*a* sequentially provided on the first TFTs 9*a*, the second TFTs 9*b*, the third TFTs 9*c* and the capacitors 9*d*.

The TFT layer 30 illustrated in FIG. 3 includes: the base coat film 11; a semiconductor pattern layer such as a semiconductor layer 12*a* to be described later; the gate insulating film 13; a first wiring layer such as a gate line 14*g* to be described later, the first interlayer insulating film 15, a second wiring layer such as an upper conductive layer 16*c* to be described later; the second interlayer insulating film 17; a third wiring layer such as a source line 18*f* to described later; the first planarization film 19*a*; a fourth wiring layer such as a power source line 20*a*; and the second planarization film 21*a*, all of which are stacked on top of another in the stated order above the resin substrate layer 10.

The TFT layer 30 illustrated in FIGS. 2 and 4 includes a plurality of the gate lines 14*g* provided as the first wiring layer and extending in parallel with one another in the horizontal direction in the drawing. Moreover, the TFT layer 30 illustrated in FIGS. 2 and 4 includes a plurality of the light-emission control lines 14*e* provided as the first wiring layer and extending in parallel with one another in the horizontal direction in the drawing. Note that, as illustrated in FIG. 2, the light-emission control lines 14*e* and the gate lines 14*g* are provided next to each other. Furthermore, the TFT layer 30 illustrated in FIGS. 2 and 4 includes a plurality of the source lines 18*f* provided as the third wiring layer and extending in parallel with one another in the vertical direction in the drawing. In addition, the TFT layer 30 illustrated in FIGS. 1 and 3 includes the power source line 20*a* provided as the fourth wiring layer in a grid and disposed between the first planarization film 19*a* and the second planarization film 21*a*. Moreover, in the TFT layer 30, as illustrated in FIG. 4, each subpixel P includes: a first TFT 9*a*; a second TFT 9*b*; a third TFT9*c*; and a capacitor 9*d*.

As illustrated in FIG. 4, in each subpixel P, the first TFT 9*a* is electrically connected to the corresponding gate line 14*g*, source line 18*f*, and second TFT 9*b*. Moreover, as illustrated in FIG. 3, the first TFT 9*a* includes: the semiconductor layer 12*a*; the gate insulating film 13; a gate electrode 14*a*; the first interlayer insulating film 15; the second interlayer insulating film 17; and a source electrode 18*a* and a drain electrode 18*b*, all of which are provided in the stated order above the base coat film 11. Here, as illustrated in FIG. 3, the semiconductor layer 12*a* is shaped into an island and provided on the base coat film 11. As will be described later, the semiconductor layer 12*a* includes a channel region, a source region, and a drain region. Moreover, as illustrated in FIG. 3, the gate insulating film 13 is provided to cover the semiconductor layer 12a. Furthermore, as illustrated in FIG. 3, the gate electrode 14a is provided on the gate insulating film 13 to overlap with the channel region of the semiconductor layer 12a. In addition, as illustrated in FIG. 3, the first interlayer insulating film 15 and the second interlayer insulating film 17 are sequentially provided to cover the gate electrode 14a. Moreover, as illustrated in FIG. 3, the source electrode 18a and the drain electrode 18b are spaced apart from each other on the second interlayer insulating film 17. Furthermore, as illustrated in FIG. 3, the source electrode 18a and the drain electrode 18b are respectively and electrically connected to the source region and the drain region of the semiconductor layer 12a through respective contact holes formed in a multilayer film including the gate insulating film 13, the first interlayer insulating film 15, and the second interlayer insulating film 17.

As illustrated in FIG. 4, in each subpixel P, the second TFT 9b is electrically connected to the corresponding first TFT 9a, power source line 20a, and third TFT 9c. Note that the second TFT 9b is substantially the same in structure as the first TFT 9a and the third TFT 9c to be described later.

As illustrated in FIG. 4, in each subpixel P, the third TFT 9c is electrically connected to the corresponding second TFT 9b, organic EL layer 33 (i.e., a first electrode 31a in contact with the organic EL layer 33) to be described later, and light-emission control line 14e to be described later. Moreover, as illustrated in FIG. 3, the third TFT 9c includes: a semiconductor layer 12b; the gate insulating film 13; a gate electrode 14b; the first interlayer insulating film 15; the second interlayer insulating film 17; and a source electrode 18c and a drain electrode 18d, all of which are provided in the stated order above the base coat film 11. Here, as illustrated in FIG. 3, the semiconductor layer 12b is shaped into an island and provided on the base coat film 11. Similar to the semiconductor layer 12a, the semiconductor layer 12b includes a channel region, a source region, and a drain region. Moreover, as illustrated in FIG. 3, the gate insulating film 13 is provided to cover the semiconductor layer 12b. Furthermore, as illustrated in FIG. 3, the gate electrode 14b is provided on the gate insulating film 13 to overlap with the channel region of the semiconductor layer 12b. In addition, as illustrated in FIG. 3, the first interlayer insulating film 15 and the second interlayer insulating film 17 are sequentially provided to cover the gate electrode 14b. Moreover, as illustrated in FIG. 3, the source electrode 18c and the drain electrode 18d are spaced apart from each other on the second interlayer insulating film 17. Furthermore, as illustrated in FIG. 3, the source electrode 18c and the drain electrode 18d are respectively and electrically connected to the source region and the drain region of the semiconductor layer 12b through respective contact holes formed in the multilayer film including the gate insulating film 13, the first interlayer insulating film 15, and the second interlayer insulating film 17.

Note that, in this embodiment, the first TFTs 9a, the second TFTs 9b, and the third TFTs 9c are, for example, top gate TFTs. Alternatively, the first TFTs 9a, the second TFTs 9b, and the third TFTs 9c may be bottom gate TFTs.

As illustrated in FIG. 4, in each subpixel P, the capacitor 9d is electrically connected to the corresponding first TFT 9a and power source line 20a. Here, as illustrated in FIG. 3, the capacitor 9d includes: a lower conductive layer 14c provided as the first wiring layer; the first interlayer insulating film 15 provided to cover the lower conductive layer 14c; and the upper conductive layer 16c provided as the second wiring layer on the first interlayer insulating film 15 to overlap with the lower conductive layer 14c. Note that the upper conductive layer 16c is electrically connected to the power source line 20a through a not-shown contact hole formed in the second interlayer insulating film 17 and the first planarization film 19a.

Each of the first planarizing film 19a and the second planarizing film 21a has a flat surface in the display region D. The first planarizing film 19a and the second planarizing film 21a are made of such a material as, for example, an organic resin material such as polyimide resin or acrylic resin, or a polysiloxane-based spin-on-glass (SOG) material. Here, as illustrated in FIG. 3, between the first planarization film 19a and the second planarization film 21a, a relay electrode 20b is provided as a fourth wiring layer other than the power source line 20a.

The organic EL element layer 35 illustrated in FIG. 3 includes: a plurality of the first electrodes 31a; an edge cover 32a; a plurality of the organic EL layers 33; and a second electrode 34, all of which are stacked on top of another in the stated order above the TFT layer 30.

As illustrated in FIG. 3, the plurality of first electrodes 31a are arranged on the second planarization film 21a in a matrix so that each of the first electrodes 31a is provided for a corresponding one of the plurality of subpixels P. Here, as illustrated in FIG. 3, the first electrode 31a is electrically connected to the drain electrode 18d of the corresponding third TFT 9c through a contact hole formed in the first planarization film 19a, the relay electrode 20b, and a contact hole formed in the second planarization film 21a. Moreover, the first electrode 31a has a function of injecting holes into the organic EL layer 33. Furthermore, the first electrode 31a is preferably formed of a material having a large work function to improve efficiency in injecting the holes into the organic EL layer 33. Here, examples of the material forming the first electrode 31a include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the first electrodes 31a may be made of, for example, an alloy of astatine (At)/astatine oxide ($AtO_2$). Furthermore, the first electrode 31a may be made of a conductive oxide such as, for example, tin oxide (SnO), zinc oxide (ZnO), indium tin oxide (ITO), or indium zinc oxide (IZO). In addition, the first electrode 31a may be formed of a plurality of layers made of the above materials and stacked on top of another. Note that examples of compound materials having a large work function include indium tin oxide (ITO) and indium zinc oxide (IZO). Specifically, the first electrode 31a is made of, for example, a multilayer film including: an ITO film having a thickness of approximately 10 nm; a silver film having a thickness of approximately 100 nm; and an ITO film having a thickness of approximately 10 nm, all of which are stacked on top of another in the stated order.

The edge cover 32a illustrated in FIG. 3 is provided in a grid to cover a peripheral end portion of each first electrode 31a. Here, the edge cover 32a is made of, for example, an organic resin material, such as polyimide resin or acrylic resin, or a polysiloxane-based SOG material, with a thickness of approximately 2.5 µm.

As illustrated in FIG. 3, the plurality of organic EL layers 33 are provided in a matrix as light-emitting functional layers, and arranged on the respective first electrodes 31a to correspond to the plurality of respective subpixels P. Here, as illustrated in FIG. 5, each of the organic EL layers 33 includes: a hole injection layer 1; a hole transport layer 2; a light-emitting layer 3, an electron transport layer 4, and an electron injection layer 5, all of which are provided in the stated order above the first electrode 31a.

The hole injection layer 1 is also referred to as an anode buffer layer. The hole injection layer 1 has a function of approximating energy levels between the first electrode 31a and the organic EL layer 33 to improve efficiency in injecting the holes from the first electrode 31a into the organic EL layer 33. Here, examples of a material forming the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has a function of improving efficiency in transporting the holes from the first electrode 31a to the organic EL layer 33. Here, examples of a material forming the hole transport layer 2 include a porphyrin derivative, an aromatic tertiary amine compound, a styryl amine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide, and zinc selenide.

The light-emitting layer 3 is a region where the holes and the electrons are respectively injected from the first electrode 31a and the second electrode 34, and recombine together, when a voltage is applied with the first electrode 31a and the second electrode 34. Here, the light-emitting layer 3 is formed of a material having a high light-emission efficiency. Examples of the material forming the light-emitting layer 3 include a metal oxinoid compound [8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, perylene derivative, a perinone derivative, an aminopyrene derivative, a pyridine derivative, a rhodamine derivative, an aquizine derivative, phenoxazone, a quinacridone derivative, rubrene, poly-p-phenylenevinylene, and polysilane.

The electron transport layer 4 has a function of efficiently moving the electrons to the light-emitting layer 3. Here, examples of a material forming the electron transport layer 4 include, as organic compounds, an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has a function of approximating energy levels between the second electrode 34 and the organic EL layer 33 to improve efficiency in injecting the electrons from the second electrode 34 into the organic EL layer 33. Such a function can decrease a drive voltage of the organic EL element. Note that the electron injection layer 5 is also referred to as a cathode buffer layer. Here, examples of a material forming the electron injection layer 5 include: inorganic alkali compounds such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

The second electrode 34 is provided on the plurality of organic EL layers 33 in common among the plurality of subpixels P. That is; as illustrated in FIG. 3, the second electrode 34 is provided to cover each of the organic EL layers 33 and the edge cover 32a. Moreover, the second electrode 34 has a function of injecting the electrons into each organic EL layer 33. Furthermore, the second electrode 34 is preferably formed of a material having a small work function to improve efficiency in injecting the electrons into the organic EL layer 33. Here, examples of the material forming the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Moreover, the second electrode 34 may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al). Furthermore, the second electrode 34 may be formed of a conductive oxide such as tin oxide (SnO), zinc oxide (ZnO), indium tin oxide (ITO), or indium zinc oxide (IZO). In addition, the second electrode 34 may be formed of a plurality of layers made of the above materials and stacked on top of another. Note that examples of the material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/ aluminum (Al), lithium (Li)/calcium (Ca)/aluminum (Al), and lithium fluoride (LiF)/calcium (Ca)/aluminum (Al).

As illustrated in FIG. 3, the sealing film 40 is provided to cover the second electrode 34, and includes: a first inorganic sealing film 36; an organic sealing film 37; and a second inorganic sealing film 38, all of which are stacked on top of another in the stated order above the second electrode 34. The sealing film 40 has a function of protecting the organic EL layers 33 in the organic EL element layer 35 from moisture and oxygen. Here, each of the first inorganic sealing film 36 and the second inorganic sealing film 38 is formed of such an inorganic insulating film as, for example, a silicon nitride film, a silicon oxide film, or a silicon oxynitride film. Moreover, the organic sealing film 37 is formed of such an organic resin material as, for example, acrylic resin, epoxy resin, silicone resin, polyurea resin, parylene resin, polyimide resin, or polyamide resin.

Furthermore, as illustrated in FIG. 1, the organic EL display device 50a includes, in the frame region F: a first dam wall Wa shaped into a picture frame and provided out of the trench G to surround the display region D; and a second dam wall Wb shaped into a picture frame and provided around the first dam wall Wa.

The first dam wall Wa illustrated in FIG. 6 includes: a lower resin layer 21b formed of the same material as, and in the same layer as, the second planarization film 21a is; and an upper resin layer 32c formed of the same material as, and in the same layer as, the edge cover 32a is, and provided above the lower resin layer 21b through a connection wire 31b. Here, the connection wire 31b is formed of the same material as, and in the same layer as, the first electrodes 31a are. Note that the first outer dam wall Wa is provided to overlap with a peripheral end portion of the organic sealing film 37 included in the sealing film 40, so as to keep ink for forming the organic sealing film 37 from spreading out.

The second dam wall Wb illustrated in FIG. 6 includes: a lower resin layer 21c formed of the same material as, and in the same layer as, the second planarization film 21a is; and an upper resin layer 32d formed of the same material as, and in the same layer as, the edge cover 32a is, and provided above the lower resin layer 21c through the connection wire 31b.

Moreover, as illustrated in FIG. 1, the organic EL display device 50a includes a first picture-frame wire 18h in the picture-frame region F. The first picture-frame wire 18h is shaped into a picture frame and provided behind the trench G as the third wiring layer. The first picture-frame wire 18h has opposing end portions provided to the opening of the trench G and extending toward the terminal unit T. Here, the first picture-frame wire 18h is electrically connected to the power source line 20a of the display region D through a contact hole formed in the first planarization film 19a, and receives a high power-source voltage (ELVDD) at the terminal unit T.

Moreover, as illustrated in FIG. 1, the organic EL display device 50a includes a second picture-frame wire 18i in the picture-frame region F. The second picture-frame wire 18i is shaped into a substantial C-shape and provided out of the trench G as the third wiring layer. The second picture-frame wire 18i has opposing end portions extending toward the terminal unit T. Here, as illustrated in FIG. 6, the second picture-frame wire 18i is electrically connected to the second electrode 34 of the display region D through the connection wire 31b provided to the trench G, and receives a low power-source voltage (ELVSS) at the terminal unit T.

Furthermore, as illustrated in FIG. 6, the organic EL display device 50a includes a plurality of peripheral photo spacers 32b provided in the picture-frame region F, and each shaped into an island and protruding upwards at opposing edge portions of the trench G. Here, the peripheral photo spacers 32b are formed of the same material as, and in the same layer as, the edge cover 32a is.

Moreover, as illustrated in FIG. 7, the organic EL display device 50a includes a slit S provided to the folding portion B of the picture-frame region F. The slit S is formed in a multilayer film including the base coat film 11, the gate insulating film 13, the first interlayer insulating film and the second interlayer insulating film 17. Here, the slit S illustrated in FIG. 7 is a thorough groove laid in a direction in which the folding portion B extends, and formed to penetrate the base coat film 11, the gate insulating film 13, the first interlayer insulating film 15, and the second interlayer insulating film 17 and to expose a surface of the resin substrate layer 10. Note that, the slit S illustrated in FIG. 7 is also provided to a surface layer (approximately 0.5 to 3.0 μm in depth) of the second resin substrate layer 8 (approximately 6 μm in thickness). Furthermore, the multilayer film formed of the base coat film 11, the gate insulating film 13, the first interlayer insulating film 15, and the second interlayer insulating film 17, and including the slit S, has opposing edge portions. As illustrated in FIG. 7, the opposing edge portions are shaped into eaves, and extend inward by approximately, for example, 0.5 μm of a sidewall on the surface layer of the second resin substrate layer 8. In addition, as illustrated in FIG. 7, the first planarization film 19a disposed in the display region D is provided to opposing sides out of the folding portion B to: fill widthwise opposing end portions of the slit S; and expose the surface of the resin substrate layer 10 in an intermediate position between the widthwise opposing end portions. Here, the first planarization film 19a illustrated in FIG. 7 fills the widthwise opposing end portions of the slit S. Hence, the first planarization film 19a is provided to fill the eaves, toward the second resin substrate layer 8, of the opposing edge portions of the multilayer film including the slit S and formed of the base coat film 11, the gate insulating film 13, the first interlayer insulating film 15, and the second interlayer insulating film 17. Moreover, as illustrated in FIG. 7, a side surface of the first planarization film 19a toward the folding portion B is inclined and forward-tapered to protrude toward the resin substrate layer 10. Furthermore, the side surface of the first planarization film 19a toward the folding portion B and the surface of the resin substrate layer 10 form an angle θ (see FIG. 7) of 20° or less. Note that if the angle θ between the side surface of the first planarization film 19a toward the folding portion B and the surface of the resin substrate layer 10 is more than 20°, a metal film that forms routed wires 20c to be described later is likely to remain between adjacent routed wires 20c when the routed wires 20c are formed. The remaining metal film might short-circuit the adjacent routed wires 20c.

Moreover, as illustrated in FIGS. 7 and 8, the organic EL display device 50a includes, in the folding portion B and at the opposing sides out of the folding portion B: the plurality of routed wires 20c provided on the first planarization film 19a and the resin substrate layer 10, and extending in parallel with one another in a direction perpendicular to the direction in which the folding portion B extends; a plurality of protective insulating layers 21d each provided to cover a corresponding one of the plurality of routed wires 20c; and a reinforcing resin layer 46 provided to cover the plurality of protective insulating layers 21d. Here, as illustrated in FIG. 7, a surface of the organic EL display device 50a toward the first resin substrate layer 6 is provided with a protective sheet 47 except for the folding portion B. Note that an interval between the left protective sheet 47 and the right protective sheet 48 is approximately, for example, 2.0 mm in width, and a distance between an end of the protective sheet 47 and the slit S is approximately, for example, 200 μm.

The routed wires 20c are provided as the fourth wiring layer, and formed of the same material as, and in the same layer as, the power source line 20a is. Here, the routed wires 20c are electrically connected to such display wires as the source lines 18f toward the display region D, and to the terminals C toward the terminal unit T.

The protective insulating layers 21d are formed of the same material as, and in the same layer as, the second planarization film 21a is.

The reinforcing resin layer 46 is made of, for example, such a material as acrylic resin having a thickness of approximately 100 μm.

The organic EL display device 50a displays an image as follows: In each of the subpixels P, a gate signal is input to the first TFT 9a through the gate line 14g to turn ON the first TFT 9a. Through the source line 18f, a predetermined voltage corresponding to a source signal is written to the gate electrode of the second TFT 9b and the capacitor 9d. When a light-emission control signal is input through the light-emission control line 14e to the third TFT 9c, the third TFT 9c turns ON. A current based on a gate voltage of the second TFT 9b is supplied from the power source line 20a to the organic EL layer 33, and the light-emitting layer 3 of the organic EL layer 33 emits light to display an image. Note that, in the organic EL display device 50a, even if the first TFT 9a turns OFF, the gate voltage of the second TFT 9b is held in the capacitor 9d. Hence, each subpixel P allows the light-emitting layer 3 to keep emitting light until a gate signal in the next frame is input.

Described next will be a method for producing the organic EL display device 50a of this embodiment. Note that the method for producing the organic EL display device 50a of this embodiment includes: a TFT-layer forming step; an organic-EL-element-layer forming step; and a sealing-film forming step.

TFT-Layer Forming Step

First, for example, a glass substrate is coated with non-photosensitive polyimide resin (approximately 6 μm in thickness). After that, the non-polyimide resin is pre-baked and post-baked to form the first resin substrate layer 6.

Next, on a substrate surface of the first resin substrate layer 6, an inorganic insulating film (approximately 500 nm in thickness) such as a silicon oxide film is deposited by, for example, plasma chemical vapor deposition (CVD). Hence, the intra-substrate inorganic insulating film 7 is formed.

Moreover, a substrate surface of the intra-substrate inorganic insulating film 7 is coated with, for example, non-photosensitive polyimide resin (approximately 10 μm in thickness). After that, the non-photosensitive polyimide resin is pre-baked and post-baked to form the second resin substrate layer 8. Hence, the resin substrate layer 10 is formed.

After that, on a substrate surface of the resin substrate layer 10, a silicon oxide film (approximately 500 nm in thickness) and a silicon nitride film (approximately 100 nm in thickness) are deposited in the stated order by, for example, the plasma CVD. Hence, the base coat film 11 is formed.

Then, on a substrate surface of the base coat film 11, for example, an amorphous silicon film (approximately 50 nm in thickness) is deposited by the plasma CVD. The amorphous silicon film is crystallized by such a technique as laser annealing to form a semiconductor film of a polysilicon film. The semiconductor film is patterned to form such a layer as the semiconductor layer 12a.

After that, on a substrate surface of such a layer as the semiconductor layer 12a, an inorganic insulating film (approximately 100 nm in thickness) such as a silicon nitride film is deposited by, for example, the plasma CVD. Hence, the gate insulating film 13 is formed to cover such a layer as the semiconductor layer 12a.

Moreover, on a substrate surface of the gate insulating film 13, a molybdenum film (approximately 250 nm in thickness) is formed by, for example, sputtering. After that, the molybdenum film is patterned to form the first wiring layer such as the gate lines 14g.

Then, using the first wiring layer as a mask, such a layer as the semiconductor layer 12a is doped with impurity ions so that an intrinsic region and a conductor region are formed in such a layer as the semiconductor layer 12a.

After that, on a substrate surface of such a layer as the semiconductor layer 12a including the intrinsic region and the conductor region, a silicon nitride film (approximately 100 nm in thickness) is deposited by, for example, the plasma CVD. Hence, the first interlayer insulating film 15 is formed.

Then, on a substrate surface of the first interlayer insulating film 15, a molybdenum film (approximately 250 nm in thickness) is formed by, for example, sputtering. After that, the molybdenum film is patterned to form the second wiring layer such as the upper conductive layer 16c.

Moreover, on a substrate upper surface of the second wiring layer, a silicon oxide film (approximately 300 nm in thickness) and a silicon nitride film (approximately 200 nm in thickness) are deposited in the stated order by, for example, the plasma CVD. Hence, the second interlayer insulating film 17 is formed.

After that, the gate insulating film 13, the first interlayer insulating film 15, and the second interlayer insulating film 17 are patterned, and contact holes are formed.

Furthermore, in the folding portion B, the multilayer film including the base coat film 11, the gate insulating film 13, the first interlayer insulating film 15, and the second interlayer insulating film 17 are removed by dry etching, using such a gas as an $SF_6$ gas, a $CF_4$ gas, an $O_2$ gas, or an Ar gas. Hence, the slit S is formed in the multilayer film including the base coat film 11, the gate insulating film 13, the first interlayer insulating film 15, and the second interlayer insulating film 17. Here, a surface layer of the second resin substrate layer 8 exposed from the slit S is also removed by dry etching.

After that, on a substrate surface provided with the slit S, a titanium film (approximately 50 nm in thickness), an aluminum film (approximately 600 nm in thickness), and a titanium film (approximately 50 nm in thickness) are deposited in the stated order by, for example, sputtering. After that, the metal multilayer film including these films is patterned to form the third wiring layer such as the source lines 18f.

Moreover, a substrate surface of the third wiring layer is coated with photosensitive polyimide resin (approximately 2.5 μm in thickness) by, for example, spin coating or slit coating. After that, the coating film is pre-baked, exposed to light, and post-baked to form such a film as the first planarization film 19a.

After that, on a substrate surface of such a film as the first planarization film 19a, a titanium film (approximately 50 nm in thickness), an aluminum film (approximately 600 nm in thickness), and a titanium film (approximately 50 nm in thickness) are deposited in the stated order by, for example, sputtering. After that, the metal multilayer film including these films is patterned to form the fourth wiring layer such as the power source line 20a and the routed wires 20c.

Finally, a substrate surface of the fourth wiring layer is coated with polyimide-based photosensitive resin (approximately 2.5 μm in thickness) by, for example, spin coating or slit coating. After that, the coating film is pre-baked, exposed to light, and post-baked to form such films as the second planarization film 21a and the protective insulating layer 21d.

As described above, the TFT layer 30 is successfully formed.

Organic-EL-Element-Layer Forming Step (Light-Emitting-Element-Layer Forming Step)

On the second planarization film 21a of the TFT layer 30 formed at the TFT-layer forming step, the first electrodes 31a, the edge cover 32a, the organic EL layers 33 (each including the hole injection layer 1, the hole transport layer 2, the light-emitting layer 3, the electron transport layer 4, and the electron injection layer 5), and the second electrode 34 are formed, using a known technique. Hence, the organic EL element layer 35 is formed.

Sealing-Film Forming Step

First, on a substrate surface of the organic EL element layer 35 formed at the organic-EL-element-layer forming step, an inorganic insulating film such as, for example, a silicon nitride film, a silicon oxide film, or a silicon oxide nitride film is deposited by plasma CVD, using a mask. Hence, the first inorganic sealing film 36 is formed.

Then, on a substrate surface of the first inorganic sealing film 36, an organic resin material such as acrylic resin is deposited by, for example, inkjet printing. Hence, the organic sealing film 37 is formed.

After that, on a substrate surface of the organic sealing film 37, an inorganic insulating film such as, for example, a silicon nitride film, a silicon oxide film, or a silicon oxide nitride film is deposited by plasma CVD, using a mask to form the second inorganic sealing film 38. Hence, the first inorganic sealing film 40 is formed.

Moreover, to a substrate surface of the sealing film 40, a not-shown front-face protective sheet is attached. After that, a laser beam is emitted from toward the glass substrate of the resin substrate layer 10, and the glass substrate is removed from a lower surface of the resin substrate layer 10. Furthermore, to the lower surface of the resin substrate layer 10 from which the glass substrate is removed, the rear-face protective sheet 47 is attached.

Then, a portion included in the front-face protective sheet and overlapping with the folding portion B and the terminal unit T is removed, and a portion included in the rear-face protective sheet 47 and overlapping with the folding portion B is also removed. After that, a front face of the folding portion B is coated with an ultraviolet cure acrylic resin with a thickness of approximately 100 μm using, for example, a dispenser. The acrylic resin is cured to form the reinforcing resin layer 46.

As described above, the organic EL display device 50a of this embodiment is successfully produced.

As described above, as to the organic EL display device 50a of this embodiment, the first planarization film 19a is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19a is not substantially found in the folding portion B located in the widthwise intermediate position of the slit S. Hence, even if the organic EL display device 50a is folded at the folding portion B, the first planarization film 19a is less likely to be cracked. Moreover, the plurality of routed wires 20c are formed of the same material as, and in the same layer as, the fourth wiring layer including the power source line 20a is. In the folding portion B and at the opposing sides out of the folding portion B, the plurality of routed wires 20c are provided on the resin substrate layer 10 and the first planarization film 19a. Such features can reduce the risks of cracks to be formed on the first planarization film 19a and breaks of the routed wires 20c in the folding portion B. Hence, the first planarization film 19a can be less likely to be cracked, and the routed wires 20c can be less likely to be broken in the folding portion B.

Furthermore, as to the organic EL display device 50a of this embodiment, the side surface of the first planarization film 19a toward the folding portion B and the surface of the resin substrate layer 10 form an angle θ of 20° or less. Such a feature can reduce the short-circuit of adjacent routed wires 20c.

Moreover, as to the organic EL display device 50a of this embodiment, the plurality of routed wires 20c are each covered with a corresponding one of the plurality of protective insulating layers 21d. Such a feature keeps aluminum layers of the respective routed wires 20c from being etched by an etchant to be used in forming the first electrodes 31a, thereby successfully reducing the risk of thinning the routed wires 20c.

Furthermore, as to the organic EL display device 50a of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50a can be readily folded at the folding portion B.

In addition, as to the organic EL display device 50a of this embodiment, the plurality of protective insulating layers 21d are spaced apart from one another and not uniformly provided over the entire folding portion B. Such a feature can reduce the risk of cracks to be formed on the plurality of protective insulating layers 21d.

Second Embodiment

Figure 9:
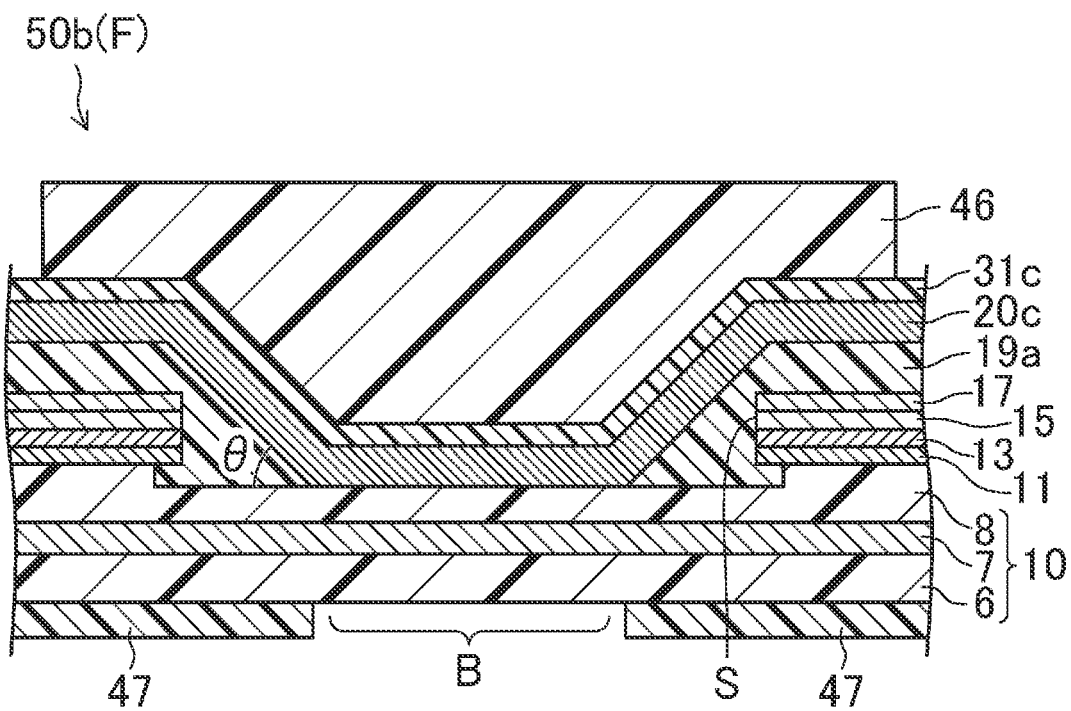
FIG. 9 is a cross-sectional view of a picture-frame region of an organic EL display device according to a second embodiment of the disclosure.
Figure 10:
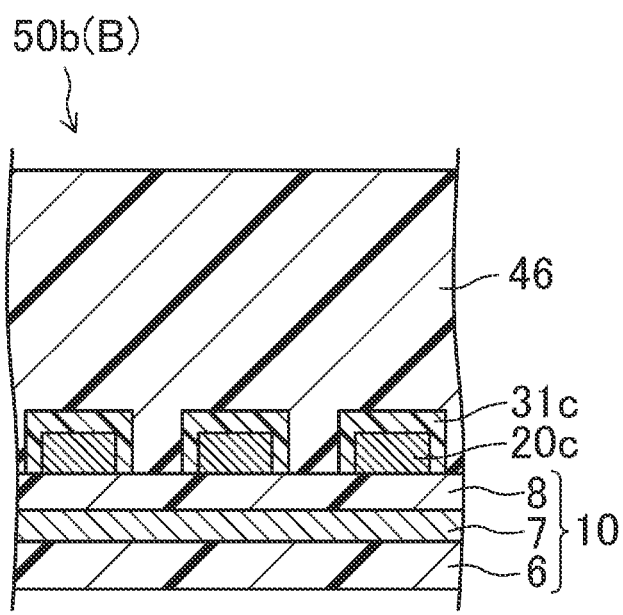
FIG. 10 is a cross-sectional view of a folding portion of the organic EL display device according to the second embodiment of the disclosure.

FIGS. 9 and 10 illustrate a display device according to a second embodiment of the disclosure. Here, FIG. 9 is a cross-sectional view of the picture-frame region F of an organic EL display device 50b of this embodiment. FIG. 9 corresponds to FIG. 7. Moreover, FIG. 10 is a cross-sectional view of the folding portion B of the organic EL display device 50b. FIG. 10 corresponds to FIG. 8. For convenience in description, like reference signs designate identical constituent features throughout FIGS. 1 to 8. These constituent features will not be elaborated upon here.

The first embodiment exemplifies the organic EL display device 50a in which the routed wires 20c are covered with the protective insulating layers 21d. This embodiment exemplifies the organic EL display device 50b in which the routed wires 20c are covered with protective conductive layers 31c.

Similar to the organic EL display device 50a of the first embodiment, the organic EL display device 50b includes the display region D and the picture-frame region F provided around the display region D.

Similar to the organic EL display device 50a of the first embodiment, the organic EL display device 50b includes: the resin substrate layer 10; the TFT layer 30 provided on the resin substrate layer 10; the organic EL element layer 35 provided on the TFT layer 30; and the sealing film 40 provided on the organic EL element layer 35.

Similar to the organic EL display device 50a of the first embodiment, the organic EL display device 50b includes, in the frame region F: the first dam wall Wa shaped into a picture frame and provided out of the trench G to surround the display region D; and the second dam wall Wb shaped into a picture frame and provided around the first dam wall Wa.

Similar to the organic EL display device 50a of the first embodiment, the organic EL display device 50b includes the first picture-frame wire 18h in the picture-frame region F. The first picture-frame wire 18h is shaped into a picture frame, and provided behind the trench G as the third wiring layer. The first picture-frame wire 18h has opposing end portions provided to the opening of the trench G and extending toward the terminal unit T.

Similar to the organic EL display device 50a of the first embodiment, the organic EL display device 50b includes the second picture-frame wire 18i in the picture-frame region F. The second picture-frame wire 18i is shaped into a substantial C-shape and provided out of the trench G as the third wiring layer. The second picture-frame wire 18i has opposing end portions extending toward the terminal unit T.

Similar to the organic EL display device 50a of the first embodiment, the organic EL display device 50b includes the plurality of peripheral photo spacers 32b provided in the picture-frame region F, and each shaped into an island and protruding upwards at opposing edge portions of the trench G.

Similar to the organic EL display device 50a of the first embodiment, as illustrated in FIG. 9, the organic EL display device 50b includes the slit S provided to the folding portion B of the picture-frame region F. The slit S is formed in a multilayer film including the base coat film 11, the gate insulating film 13, the first interlayer insulating film 15, and the second interlayer insulating film 17.

As illustrated in FIGS. 9 and 10, the organic EL display device 50b includes, in the folding portion B and at the opposing sides out of the folding portion B: the plurality of routed wires 20c provided on the first planarization film 19a and the resin substrate layer 10, and extending in parallel with one another in a direction perpendicular to the direction in which the folding portion B extends; the plurality of protective conductive layers 31c each provided to cover a corresponding one of the routed wires 20c; and the reinforcing resin layer 46 provided to cover the plurality of protective conductive layers 31c. Here, similar to the organic EL display device of the first embodiment, a surface of the organic EL display device 50b toward the first resin substrate layer 6 is provided with the protective sheet 47 except for the folding portion B, as illustrated in FIG. 9. Note that if the protective conductive layers 31c have a thickness of approximately 100 nm, it is difficult to completely cover the routed wires 20c. However, the routed wires 20c are covered with a resist pattern to be used when the protective conductive layers 31c are patterned, and the resist pattern has a thickness of approximately 2 μm. Such a feature can keep aluminum layers of the respective routed wires 20c from being etched by an etchant to be used in forming the first electrodes 31a (and the protective conductive layers 31c).

The protective conductive layers 31c are formed of the same material as, and in the same layer as, the first electrodes 31a are.

Similar to the organic EL display device 50a of the first embodiment, the organic EL display device 50b is flexible. The organic EL display device 50b displays an image when, in each of the subpixels P, the light-emitting layer 3 of the organic EL layer 33 appropriately emits light through the first TFT 9a, the second TFT 9b, and the third TFT 9c.

The organic EL display device 50b of this embodiment can be produced by the method for producing the organic EL display device 50a of the first embodiment. In forming the second planarization film 21a in the production method, the protective conductive layers 31c are formed in forming the first electrodes 31a, instead the protective insulating layers 21d to be formed in forming the second planarization film 21a. Thus, the organic EL display device 50b is successfully produced.

As described above, as to the organic EL display device 50b of this embodiment, the first planarization film 19a is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19a is not substantially found in the folding portion B located in the widthwise intermediate position of the slit S. Hence, even if the organic EL display device 50b is folded at the folding portion B, the first planarization film 19a is less likely to be cracked.

Moreover, the plurality of routed wires 20c are formed of the same material as, and in the same layer as, the fourth wiring layer including the power source line 20a is. In the folding portion B and at the opposing sides out of the folding portion B, the plurality of routed wires 20c are provided on the resin substrate layer 10 and the first planarization film 19a. Such features can reduce the risks of cracks to be formed on the first planarization film 19a and breaks of the routed wires 20c in the folding portion B. Hence, the first planarization film 19a can be less likely to be cracked, and the routed wires 20c can be less likely to be broken in the folding portion B.

Furthermore, as to the organic EL display device 50b of this embodiment, the side surface of the first planarization film 19a toward the folding portion B and the surface of the resin substrate layer 10 form an angle θ of 20° or less. Such a feature can reduce the short-circuit of adjacent routed wires 20c.

Moreover, as to the organic EL display device 50b of this embodiment, each of the plurality of routed wires 20c is covered with a corresponding one of the plurality of protective conductive layers 31c. Such a feature keeps aluminum layers of the respective routed wires 20c from being etched by an etchant to be used in forming the first electrodes 31a, thereby successfully reducing the risk of thinning the routed wires 20c.

Furthermore, as to the organic EL display device 50b of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50b can be readily folded at the folding portion B.

In addition, as to the organic EL display device 50b of this embodiment, in the folding portion B, there is no layer formed of the same material as, or in the same layer as, the second planarization film 21a is. Thanks to such a feature, even if the organic EL display device 50b is folded at the folding portion B, the second planarization film 21a is less likely to be cracked. Hence, the second planarization film 21a can be less likely to be cracked, and the routed wires can be much less likely to be broken in the folding portion B.

Third Embodiment

Figure 11:
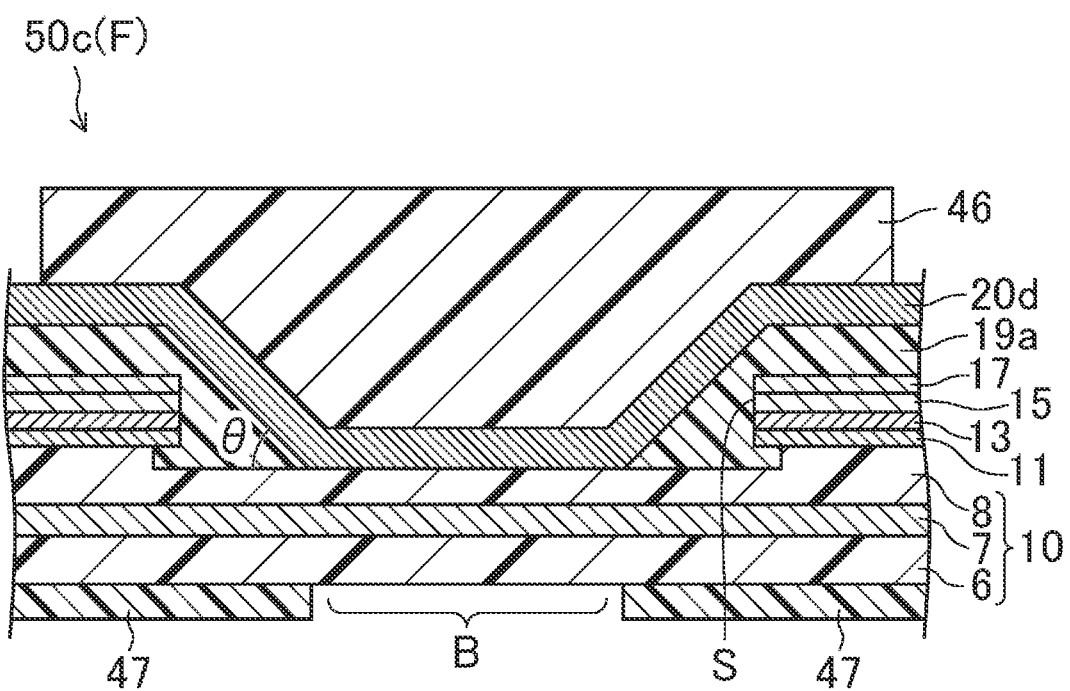
FIG. 11 is a cross-sectional view of a picture-frame region of an organic EL display device according to a third embodiment of the disclosure.

FIG. 11 illustrates a display device according to a third embodiment of the disclosure. FIG. 11 is a cross-sectional view of the picture-frame region F of an organic EL display device of this embodiment. FIG. 11 corresponds to FIG. 7.

The first and second embodiments exemplify the organic EL display devices 50a and in which the routed wires 20c are covered with the protective insulating layers 21d and the protective conductive layers 31c. This embodiment exemplifies the organic EL display device in which the routed wires 20c are not covered with neither the protective insulating layers 21d nor the protective conductive layers 31c.

Similar to the organic EL display device 50a of the first embodiment, the organic EL display device 50c includes the display region D and the picture-frame region F provided around the display region D.

Similar to the organic EL display device 50a of the first embodiment, the organic EL display device 50c includes: the resin substrate layer 10; the TFT layer 30 provided on the resin substrate layer 10; the organic EL element layer 35 provided on the TFT layer 30; and the sealing film 40 provided on the organic EL element layer 35.

Similar to the organic EL display device 50a of the first embodiment, the organic EL display device 50c includes, in the frame region F: the first dam wall Wa shaped into a picture frame and provided out of the trench G to surround the display region D; and the second dam wall Wb shaped into a picture frame and provided around the first dam wall Wa.

Similar to the organic EL display device 50a of the first embodiment, the organic EL display device 50c includes the first picture-frame wire 18h in the picture-frame region F. The first picture-frame wire 18h is shaped into a picture frame, and provided behind the trench G as the third wiring layer. The first picture-frame wire 18h has opposing end portions provided to the opening of the trench G and extending toward the terminal unit T.

Similar to the organic EL display device 50a of the first embodiment, the organic EL display device 50c includes the second picture-frame wire 18i in the picture-frame region F. The second picture-frame wire 18i is shaped into a substantial C-shape and provided out of the trench G as the third wiring layer. The second picture-frame wire 18i has opposing end portions extending toward the terminal unit T.

Similar to the organic EL display device 50a of the first embodiment, the organic EL display device 50c includes the plurality of peripheral photo spacers 32b provided in the picture-frame region F, and each shaped into an island and protruding upwards at opposing edge portions of the trench G.

Similar to the organic EL display device 50a of the first embodiment, as illustrated in FIG. 11, the organic EL display device 50c includes the slit S provided to the folding portion B of the picture-frame region F. The slit S is formed in a multilayer film including the base coat film 11, the gate insulating film 13, the first interlayer insulating film 15, and the second interlayer insulating film 17.

As illustrated in FIG. 11, the organic EL display device 50c includes, in the folding portion B and at the opposing sides out of the folding portion B: a plurality of routed wires 20d provided on the first planarization film 19a and the resin substrate layer 10, and extending in parallel with one another in a direction perpendicular to the direction in which the folding portion B extends; and the reinforcing resin layer 46 provided to cover the plurality of routed wires 20d. Here, similar to the organic EL display device 50a of the first embodiment, a surface of the organic EL display device 50c toward the first resin substrate layer 6 is provided with the protective sheet 47 except for the folding portion B, as illustrated in FIG. 11.

The routed wires 20d are provided as the fourth wiring layer, and formed of the same material as, and in the same layer as, the power source line 20a is. Here, the routed wires 20d are electrically connected to such display wires as the source lines 18f toward the display region D, and to the terminals C toward the terminal unit T. Note that a width of the routed wires 20d is, for example, approximately 10 μm, and wider than a width of the routed wires 20c (e.g., approximately 6 μm) of the first embodiment in consideration of wire thinning caused by an etchant to be used in forming the first electrodes 31a.

Similar to the organic EL display device 50a of the first embodiment, the organic EL display device 50c is flexible. The organic EL display device 50c displays an image when, in each of the subpixels P, the light-emitting layer 3 of the organic EL layer 33 appropriately emits light through the first TFT 9a, the second TFT 9b, and the third TFT 9c.

The organic EL display device 50c of this embodiment can be produced by the method for producing the organic EL display device 50a of the first embodiment. In the production method, the width of the routed wires 20c is changed in forming the power source line 20a, instead of forming the protective insulating layers 21d in forming the second planarization film 21a. Thus, the organic EL display device 50c is successfully produced.

As described above, as to the organic EL display device 50c of this embodiment, the first planarization film 19a is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19a is not substantially found in the folding portion B located in the widthwise intermediate position of the slit S. Hence, even if the organic EL display device 50c is folded at the folding portion B, the first planarization film 19a is less likely to be cracked. Moreover, the plurality of routed wires 20d are formed of the same material as, and in the same layer as, the fourth wiring layer including the power source line 20a is. In the folding portion B and at the opposing sides out of the folding portion B, the plurality of routed wires 20d are provided on the resin substrate layer 10 and the first planarization film 19a. Such features can reduce the risks of cracks to be formed on the first planarization film 19a and breaks of the routed wires 20d in the folding portion B. Hence, the first planarization film 19a can be less likely to be cracked, and the routed wires 20d can be less likely to be broken in the folding portion B.

Furthermore, as to the organic EL display device 50c of this embodiment, the side surface of the first planarization film 19a toward the folding portion B and the surface of the resin substrate layer 10 form an angle θ of 20° or less. Such a feature can reduce the short-circuit of adjacent routed wires 20d.

Furthermore, as to the organic EL display device 50c of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50c can be readily folded at the folding portion B.

In addition, as to the organic EL display device 50c of this embodiment, in the folding portion B, there is no layer formed of the same material as, or in the same layer as, the second planarization film 21a is. Thanks to such a feature, even if the organic EL display device 50c is folded at the folding portion B, the second planarization film 21a is less likely to be cracked. Hence, the second planarization film 21a can be less likely to be cracked, and the routed wires 20d can be much less likely to be broken in the folding portion B.

Fourth Embodiment

Figure 12:
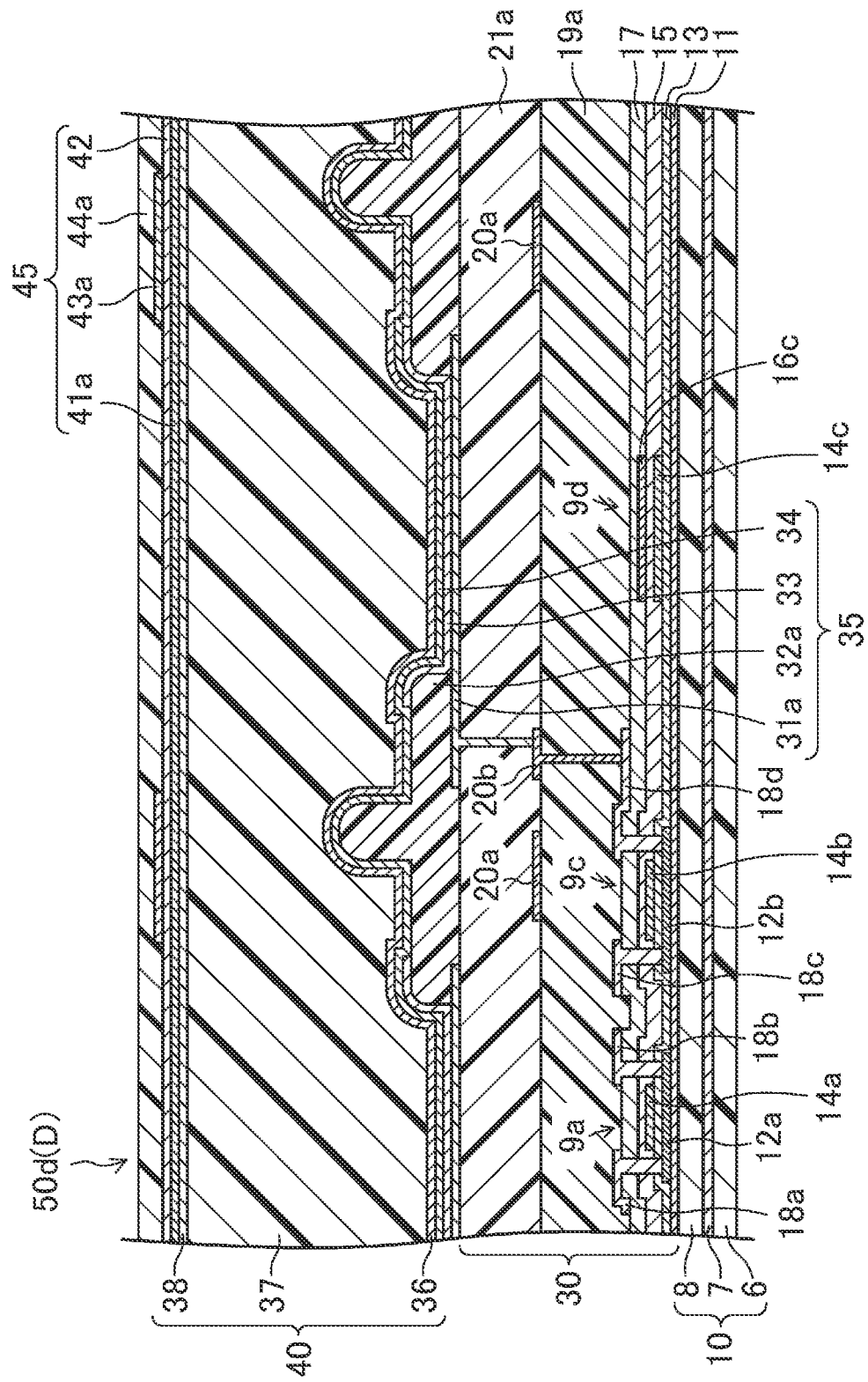
FIG. 12 is a cross-sectional view of a display region of an organic EL display device according to a fourth embodiment of the disclosure.
Figure 13:
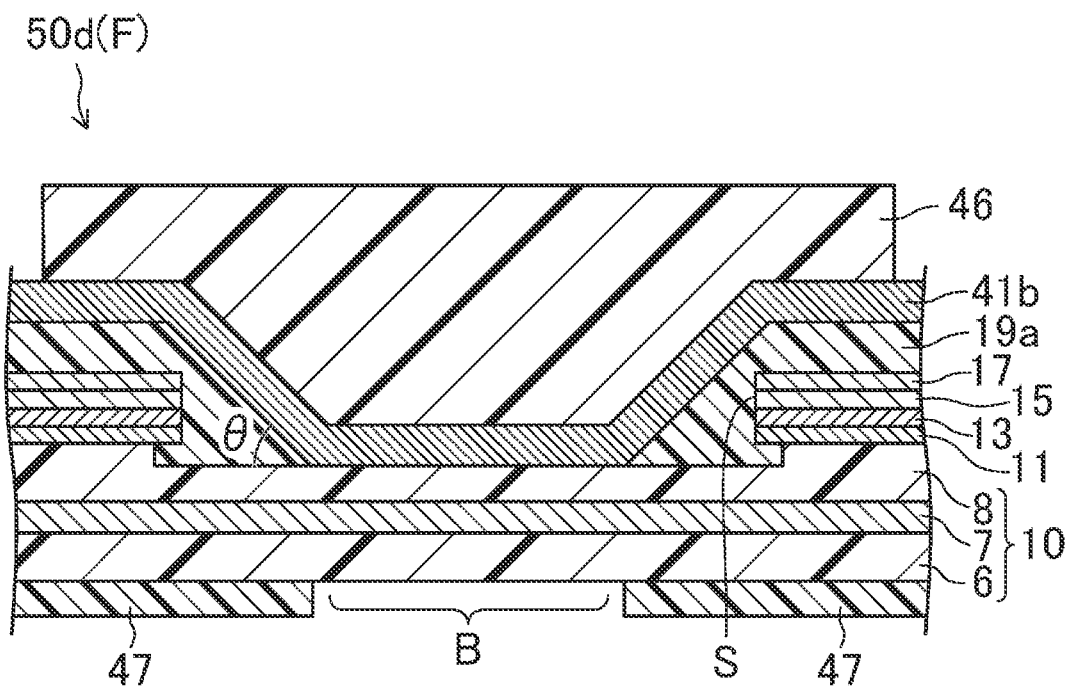
FIG. 13 is a cross-sectional view of a picture-frame region of the organic EL display device according to the fourth embodiment of the disclosure.
Figure 14:
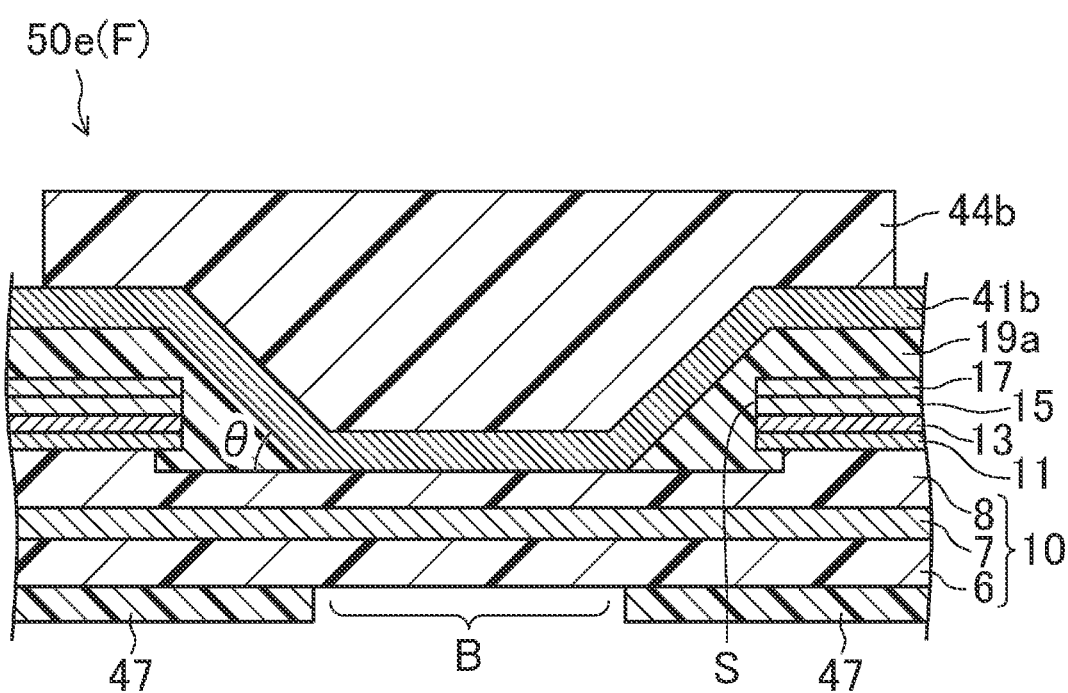
FIG. 14 is a cross-sectional view of the picture-frame region in a modification of the organic EL display device according to the fourth embodiment of the disclosure.

FIGS. 12 and 13 illustrate a display device according to a fourth embodiment of the disclosure. Here, FIG. 12 is a cross-sectional view of the display region D of an organic EL display device 50d according to this embodiment. FIG. 12 corresponds to FIG. 3. Moreover, FIG. 13 is a cross-sectional view of the picture-frame region F of the organic EL display device 50d. FIG. 11 corresponds to FIG. 7. Furthermore, FIG. 14 is a cross-sectional view of a picture-frame region of an organic EL display device 50*e* exemplified as a modification of the organic EL display device 50*d*. FIG. 14 corresponds to FIG. 7.

The first, second, and third embodiments exemplify the organic EL display devices 50*a*, and 50*c* without a touch panel layer. This embodiment exemplifies the organic EL display device 50*d* including a touch panel layer 45.

Similar to the organic EL display device 50*a* of the first embodiment, the organic EL display device 50*d* includes the display region D and the picture-frame region F provided around the display region D.

As illustrated in FIG. 12, the organic EL display device 50*d* includes: the resin substrate layer 10; the TFT layer 30 provided on the resin substrate layer 10; the organic EL element layer provided on the TFT layer 30 as a light-emitting element layer; the sealing film 40 provided to cover the organic EL element layer 35; and the touch panel layer 45 provided on the sealing film 40.

As illustrated in FIG. 12, the touch panel layer 45 is provided on the sealing film 40, and includes: a first touch wiring layer 41*a*; a third interlayer insulating film 42; a second touch wiring layer 43*a*; and an overcoat film 44*a*, all of which are stacked on top of another in the stated order above the second inorganic sealing film 38 of the sealing film 40.

The first touch wiring layer 41*a* illustrated in FIG. 12 includes a plurality of first touch wiring layers 41*a* provided on the second inorganic sealing film 38. In the display region D, the plurality of first touch wiring layers 41*a* extend, for example, in the X-direction of FIG. 1 in parallel with one another.

The third interlayer insulating film 42 illustrated in FIG. 12 is provided to cover each of the first touch wiring layers 41*a*. Here, the third interlayer insulating film 42 is formed of such an inorganic insulating film as, for example, a silicon nitride film, a silicon oxide film, or a silicon oxynitride film. Alternatively, the third interlayer insulating film 42 is formed of a multilayer film including these films.

The second touch wiring layer 43*a* illustrated in FIG. 12 includes a plurality of second touch wiring layers 43*a* provided on the third interlayer insulating film 42. In the display region D, the plurality of second touch wiring layers 43*a* extend, for example, in the Y-direction of FIG. 1 in parallel with one another.

The overcoat film 44*a* illustrated in FIG. 12 is provided on the third interlayer insulating film 42 to cover each of the second touch wiring layers 43*a*.

Similar to the organic EL display device 50*a* of the first embodiment, the organic EL display device 50*d* includes, in the frame region F: the first dam wall Wa shaped into a picture frame and provided out of the trench G to surround the display region D; and the second dam wall Wb shaped into a picture frame and provided around the first dam wall Wa.

Similar to the organic EL display device 50*a* of the first embodiment, the organic EL display device 50*d* includes the first picture-frame wire 18*h* in the picture-frame region F. The first picture-frame wire 18*h* is shaped into a picture frame, and provided behind the trench G as the third wiring layer. The first picture-frame wire 18*h* has opposing end portions provided to the opening of the trench G and extending toward the terminal unit T.

Similar to the organic EL display device 50*a* of the first embodiment, the organic EL display device 50*d* includes the second picture-frame wire 18*i* in the picture-frame region F. The second picture-frame wire 18*i* is shaped into a substantial C-shape and provided out of the trench G as the third wiring layer. The second picture-frame wire 18*i* has opposing end portions extending toward the terminal unit T.

Similar to the organic EL display device 50*a* of the first embodiment, the organic EL display device 50*d* includes the plurality of peripheral photo spacers 32*b* provided in the picture-frame region F, and each shaped into an island and protruding upwards at opposing edge portions of the trench G.

Similar to the organic EL display device 50*a* of the first embodiment, as illustrated in FIG. 13, the organic EL display device 50*d* includes the slit S provided to the folding portion B of the picture-frame region F. The slit S is formed in a multilayer film including the base coat film 11, the gate insulating film 13, the first interlayer insulating film 15, and the second interlayer insulating film 17.

As illustrated in FIG. 13, the organic EL display device 50*d* includes, in the folding portion B and at the opposing sides out of the folding portion B: a plurality of routed wires 41*b* provided on the first planarization film 19*a* and the resin substrate layer 10, and extending in parallel with one another in a direction perpendicular to the direction in which the folding portion B extends; and the reinforcing resin layer 46 provided to cover the plurality of routed wires 41*b*. Here, similar to the organic EL display device 50*a* of the first embodiment, a surface of the organic EL display device 50*d* toward the first resin substrate layer 6 is provided with the protective sheet 47 except for the folding portion B, as illustrated in FIG. 13.

The routed wires 41*b* are formed of the same material as, and in the same layer as, the first touch wiring layers 41*a* are. Here, the routed wires 41*b* are electrically connected to such display wires as the source lines 18*f* toward the display region D, and to the terminals C toward the terminal unit T. Note that this embodiment exemplifies the routed wires 41*b* formed of the same material as, and in the same layer as, the first touch wiring layers 41*a* are. Alternatively, the routed wires 41*d* may be formed of the same material as, and in the same layer as, the second touch wiring layers 43*a* are.

Note that this embodiment exemplifies the organic EL display device 50*d* in which the reinforcing resin layer 46 is provided to cover the routing wires 41*b* in the folding portion B and at the opposing sides out of the folding portion B. Alternatively, the organic EL display device may also be an organic EL display device 50*e* including an overcoat layer 44*b* provided to cover each of the routing wires 41*b* in the folding portion B and at the opposing sides out of the folding portion B. Here, the overcoat layer 44*b* is formed of the same material as, and in the same layer as, the overcoat film 44*a* provided in the display region D is. This organic EL display device eliminates the need for forming the reinforcing resin layer 46 in the folding portion B, unlike the organic EL display device 50*d*. Such a feature makes it possible to reduce production costs of the organic EL display device 50*e*. Note that the first planarization film 19*a* and the second planarization film 21*a* formed at the TFT-layer forming step have to be high-definition films resistant to high temperature. However, the overcoat film 44*a* and the overcoat layer 44*b* formed after the TFT-layer formation step do not have to be high-definition films resistant to high temperature, and cracks are less likely to form material-wise.

Similar to the organic EL display device 50*a* of the first embodiment, the organic EL display device 50*d* is flexible. The organic EL display device 50*d* displays an image when, in each of the subpixels P, the light-emitting layer 3 of the organic EL layer 33 appropriately emits light through the first TFT 9*a*, the second TFT 9*b*, and the third TFT 9*c*. Moreover, as to the organic EL display device 50*d*, when the surface of the overcoat layer 44a in the display region D is touched, the electrostatic capacity generated at an intersection of the first touch wiring layers 41a and the second touch wiring layers 43a changes. In accordance with the change, the position detecting circuit calculates and detects the touched position.

The organic EL display device 50d of this embodiment can be produced as follows: at the sealing-film forming step of the method for producing the organic EL display device 50a of the first embodiment, a touch-panel forming step below is carried out between the step of forming the sealing film 40 and a step of attaching the front-face protective sheet to the substrate surface of the sealing film 40. Thus, the organic EL display device 50d is successfully produced.

Touch-Panel-Layer Forming Step

First, on the substrate surface of the sealing film 40 formed at the sealing-film forming step, a titanium film (approximately 50 nm in thickness), an aluminum film (approximately 300 nm in thickness), and a titanium film (approximately 50 nm in thickness) are deposited in the stated order by, for example, sputtering. After that, the metal multilayer film including these films is patterned to form such layers as the first touch wiring layers 41a.

Then, on substrate surfaces of such layers as the first touch wiring layers 41a, a silicon oxide film (approximately 400 nm) is deposited by, for example, the plasma CVD. Hence, the third interlayer insulating film 42 is formed.

Moreover, on a substrate surface of the third interlayer insulating film 42, a titanium film (approximately 50 nm in thickness), an aluminum film (approximately 300 nm in thickness), and a titanium film (approximately 50 nm in thickness) are deposited in the stated order by, for example, sputtering. After that, the metal multilayer film including these films is patterned to form such layers as the second touch wiring layers 43a.

After that, substrate surfaces of such layers as the second touch wiring layers 43a are coated with transparent photosensitive acrylic resin (approximately 2.0 μm in thickness) by, for example, spin coating or slit coating. After that, the coating film is pre-baked, exposed to light, and post-baked to form the overcoat film 44a. Hence, the touch panel layer 45 is formed.

As described above, as to the organic EL display device 50d of this embodiment, the first planarization film 19a is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19a is not substantially found in the folding portion B located in the widthwise intermediate position of the slit S. Hence, even if the organic EL display device 50d is folded at the folding portion B, the first planarization film 19a is less likely to be cracked. Moreover, the plurality of routed wires 41b are formed of the same material as, and in the same layer as, the first touch wiring layers 41a are. In the folding portion B and at the opposing sides out of the folding portion B, the plurality of routed wires 41b are provided on the resin substrate layer 10 and the first planarization film 19a. Such features can reduce the risks of cracks to be formed on the first planarization film 19a and breaks of the routed wires 41b in the folding portion B. Hence, the first planarization film 19a can be less likely to be cracked, and the routed wires 41b can be less likely to be broken in the folding portion B.

Furthermore, as to the organic EL display device 50d of this embodiment, the side surface of the first planarization film 19a toward the folding portion B and the surface of the resin substrate layer 10 form an angle θ of 20° or less. Such a feature can reduce the short-circuit of adjacent routed wires 41b.

Furthermore, as to the organic EL display device 50d of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50d can be readily folded at the folding portion B.

In addition, as to the organic EL display device 50d of this embodiment, in the folding portion B, there is no layer formed of the same material as, or in the same layer as, the second planarization film 21a is. Thanks to such a feature, even if the organic EL display device 50d is folded at the folding portion B, the second planarization film 21a is less likely to be cracked. Hence, the second planarization film 21a can be less likely to be cracked, and the routed wires 41b can be much less likely to be broken in the folding portion B.

Moreover, as to the organic EL display device 50d of this embodiment, the plurality of routed wires 41b are formed of the same material as, and in the same layer as, the first touch wiring layers 41a are. Such a feature keeps the routed wires 41b from being etched by an etchant to be used in forming the first electrodes 31a, thereby eliminating the risk of thinning the routed wires 41b.

Fifth Embodiment

Figure 15:
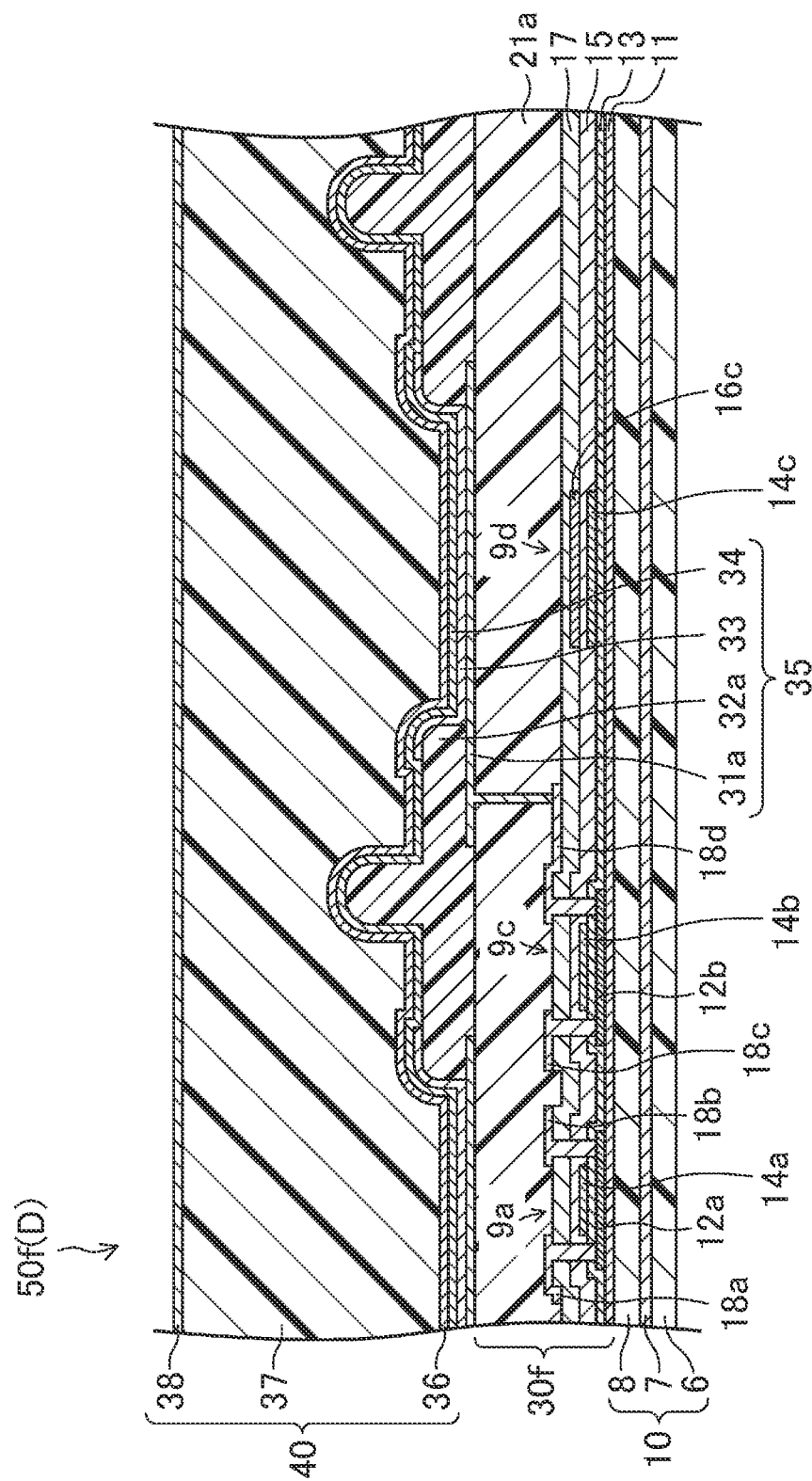
FIG. 15 is a cross-sectional view of a display region of an organic EL display device according to a fifth embodiment of the disclosure.
Figure 16:
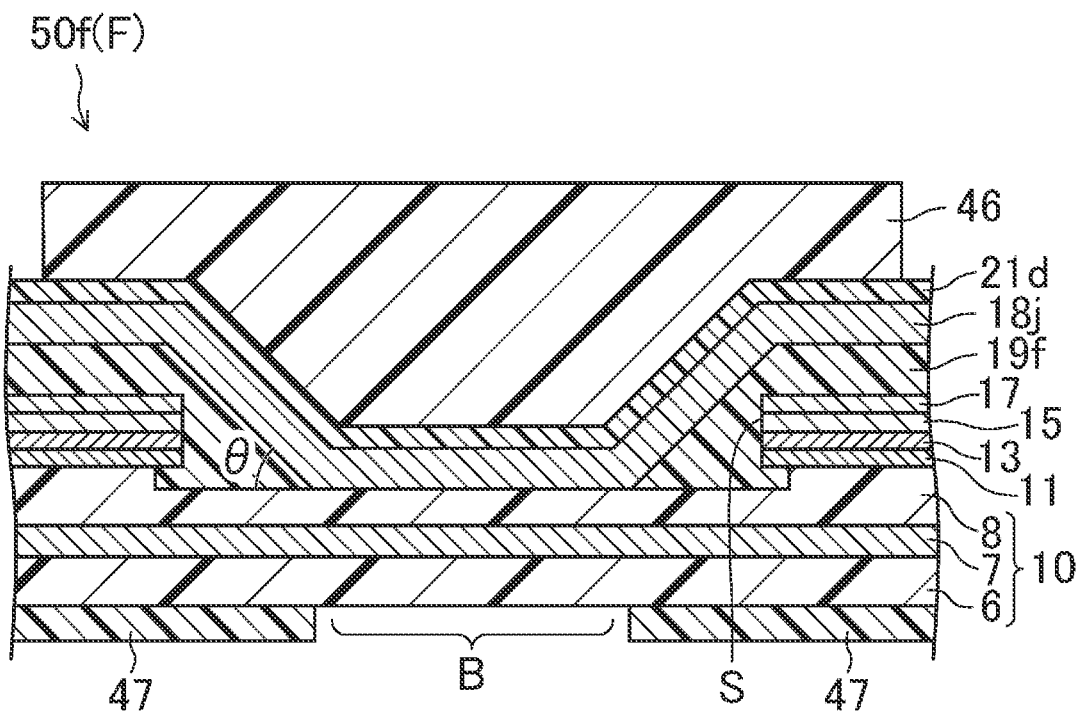
FIG. 16 is a cross-sectional view of a picture-frame region of the organic EL display device according to the fifth embodiment of the disclosure.

FIGS. 15 and 16 illustrate a display device according to a fifth embodiment of the disclosure. Here, FIG. 15 is a cross-sectional view of the display region D of an organic EL display device 50f according to this embodiment. FIG. 15 corresponds to FIG. 3. Moreover, FIG. 16 is a cross-sectional view of the picture-frame region F of the organic EL display device 50f FIG. 16 corresponds to FIG. 7.

The first, second, third and fourth embodiments exemplify the organic EL display devices 50a, 50b, 50c, and 50d (50e) each including the TFT layer 30 having, as the fourth wiring layer, such lines as the power source lines 20a. This embodiment exemplifies the organic EL display device 50f including a TFT layer 30f without the fourth wiring layer.

Similar to the organic EL display device 50a of the first embodiment, the organic EL display device 50f includes the display region D and the picture-frame region F provided around the display region D.

As illustrated in FIG. 15, the organic EL display device 50f includes: the resin substrate layer 10; the TFT layer 30f provided on the resin substrate layer 10; the organic EL element layer provided on the TFT layer 30f; and the sealing film 40 provided to cover the organic EL element layer 35.

The TFT layer 30f illustrated in FIG. 15 includes: the base coat film 11 provided on the resin substrate layer 10; the plurality of first TFTs 9a, the plurality of second TFTs 9b (see FIG. 4), the plurality of third TFTs 9c, and the plurality of capacitors 9d, all of which are provided on the base coat film 11; and the second planarization film 21a provided on each of the first TFTs 9a, each of the second TFTs 9b, and each of the third TFTs 9c.

The TFT layer 30f illustrated in FIG. 15 includes: the base coat film 11; the semiconductor pattern layer such as the semiconductor layer 12a; the gate insulating film 13; the first wiring layer such as the gate electrode 14a; the first interlayer insulating film 15, the second wiring layer such as the upper conductive layer 16c; the second interlayer insulating film 17; the third wiring layer such as the source electrode 18a; and the second planarization film 21a, all of which are stacked on top of another in the stated order above the resin substrate layer 10.

Similar to the TFT layer 30 of the organic EL display device 50a according to the first embodiment, the TFT layer 30f includes the plurality of gate lines 14g as the first wiring layer. Moreover, similar to the TFT layer 30 of the organic EL display device 50a according to the first embodiment, the TFT layer 30f includes, as the first wiring layer, the plurality of light-emission control lines 14e extending in parallel with one another. Furthermore, similar to the TFT layer 30 of the organic EL display device 50a according to the first embodiment, the TFT layer 30f includes, as the third wiring layer, the plurality of source lines 18f extending in parallel with one another. In addition, the TFT layer 30f includes, as the third wiring layer, a plurality of not-shown power source lines extending in parallel with one another. Here, the power source lines and the source lines 18f are provided next to each other. Moreover, similar to the TFT layer 30 of the organic EL display device 50a according to the first embodiment, in the TFT layer 30f, each subpixel P includes: a first TFT 9a; a second TFT 9b; a third TFT 9c; and a capacitor 9d. Here, the upper conductive layer 16c of the capacitor 9d is electrically connected to a power source line through a contact hole formed in the second interlayer insulating film 17.

Similar to the organic EL display device 50a of the first embodiment, the organic EL display device 50f includes, in the frame region F: the first dam wall Wa shaped into a picture frame and provided out of the trench G to surround the display region D; and the second dam wall Wb shaped into a picture frame and provided around the first dam wall Wa.

Similar to the organic EL display device 50a of the first embodiment, the organic EL display device 50f includes the first picture-frame wire 18h in the picture-frame region F. The first picture-frame wire 18h is shaped into a picture frame, and provided behind the trench G as the third wiring layer. The first picture-frame wire 18h has opposing end portions provided to the opening of the trench G and extending toward the terminal unit T.

Similar to the organic EL display device 50a of the first embodiment, the organic EL display device 50f includes the second picture-frame wire 18i in the picture-frame region F. The second picture-frame wire 18i is shaped into a substantial C-shape and provided out of the trench G as the third wiring layer. The second picture-frame wire 18i has opposing end portions extending toward the terminal unit T.

Similar to the organic EL display device 50a of the first embodiment, the organic EL display device 50f includes the plurality of peripheral photo spacers 32b provided in the picture-frame region F, and each shaped into an island and protruding upwards at opposing edge portions of the trench G.

Similar to the organic EL display device 50a of the first embodiment, as illustrated in FIG. 16, the organic EL display device 50f includes the slit S provided to the folding portion B of the picture-frame region F. The slit S is formed in a multilayer film including the base coat film 11, the gate insulating film 13, the first interlayer insulating film 15, and the second interlayer insulating film 17. Here, as illustrated in FIG. 16, a first planarization film 19f is provided as an other planarization film to the opposing sides out of the folding portion B to: fill widthwise opposing end portions of the slit S; and expose the surface of the resin substrate layer 10 in an intermediate position between the widthwise opposing end portions. Note that the first planarizing film 19f is made of such a material as, for example, an organic resin material such as polyimide resin or acrylic resin, or a polysiloxane-based spin-on-glass (SOG) material. Then, the first planarization film 19f illustrated in FIG. 16 fills the widthwise opposing end portions of the slit S. Hence, the first planarization film 19f is provided to fill the eaves, toward the second resin substrate layer 8, of the opposing edge portions of the multilayer film provided with the slit S and including the base coat film 11, the gate insulating film 13, the first interlayer insulating film 15, and the second interlayer insulating film 17. Moreover, as illustrated in FIG. 16, a side surface of the first planarization film 19f toward the folding portion B is inclined and forward-tapered to protrude toward the resin substrate layer 10. Furthermore, the side surface of the first planarization film 19f toward the folding portion B and the surface of the resin substrate layer 10 form an angle θ (see FIG. 16) of 20° or less. Note that if the angle θ between the side surface of the first planarization film 19f toward the folding portion B and the surface of the resin substrate layer 10 is more than 20°, a metal film that forms routed wires 18j to be described later is likely to remain between adjacent routed wires 18j when the routed wires 18j are formed. The remaining metal film might short-circuit the adjacent routed wires 18j.

Moreover, as illustrated in FIG. 16, the organic EL display device 50f includes, in the folding portion B and at the opposing sides out of the folding portion B: the plurality of routed wires 18j provided on the first planarization film 19f and the resin substrate layer 10, and extending in parallel with one another in a direction perpendicular to the direction in which the folding portion B extends; the plurality of protective insulating layers 21d each provided to cover a corresponding one of the plurality of routed wires 18j; and the reinforcing resin layer 46 provided to cover the plurality of protective insulating layer 21d. Here, similar to the organic EL display device 50a of the first embodiment, a surface of the organic EL display device 50f toward the first resin substrate layer 6 is provided with the protective sheet 47 except for the folding portion B, as illustrated in FIG. 16.

The routed wires 18j are provided as the third wiring layer, and formed of the same material as, and in the same layer as, the source lines 18f are. Here, the routed wires 18j are electrically connected to such display wires as the source lines 18f toward the display region D, and to the terminals C toward the terminal unit T.

Similar to the organic EL display device 50a of the first embodiment, the organic EL display device 50f is flexible. The organic EL display device 50d displays an image when, in each of the subpixels P, the light-emitting layer 3 of the organic EL layer 33 appropriately emits light through the first TFT 9a, the second TFT 9b, and the third TFT 9c.

The organic EL display device 50f of this embodiment can be produced as follows: At the TFT-layer forming step of the method for producing the organic EL display device 50a of the first embodiment, the slit S is formed, and, after that, the first planarization film 19f is provided only to the opposing sides out of the folding portion B. Then, the third wiring layer including the source lines 18f and the second planarization film 21a are sequentially formed to form the TFT layer 30f Thus, the organic EL display device 50f is successfully produced.

As described above, as to the organic EL display device 50f of this embodiment, the first planarization film 19f is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19f is not substantially found in the folding portion B located in the widthwise intermediate position of the slit S. Hence, even if the organic EL display device 50f is folded at the folding portion B, the first planarization film 19f is less likely to be cracked. Moreover, the plurality of routed wires 18j are formed of the same material as, and in the same layer as, the third wiring layer including the source lines 18f is. In the folding portion B and at the opposing sides out of the folding portion B, the plurality of routed wires 18j are provided on the resin substrate layer 10 and the first planarization film 19f Such features can reduce the risks of cracks to be formed on the first planarization film 19f and breaks of the routed wires 18j in the folding portion B. Hence, the first planarization film 19f can be less likely to be cracked, and the routed wires 18j can be less likely to be broken in the folding portion B.

Furthermore, as to the organic EL display device 50f of this embodiment, the side surface of the first planarization film 19f toward the folding portion B and the surface of the resin substrate layer 10 form an angle θ of 20° or less. Such a feature can reduce the short-circuit of adjacent routed wires 18j.

Moreover, as to the organic EL display device 50f of this embodiment, each of the plurality of routed wires 18j is covered with a corresponding one of the plurality of protective insulating layers 21d. Such a feature keeps aluminum layers of the respective routed wires 18j from being etched by an etchant to be used in forming the first electrodes 31a, thereby successfully reducing the risk of thinning the routed wires 18j.

Furthermore, as to the organic EL display device 50f of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50f can be readily folded at the folding portion B.

In addition, as to the organic EL display device 50f of this embodiment, the plurality of protective insulating layers 21d are spaced apart from one another and not uniformly provided over the entire folding portion B. Such a feature can reduce the risk of cracks to be formed on the plurality of protective insulating layers 21d.

Sixth Embodiment

Figure 17:
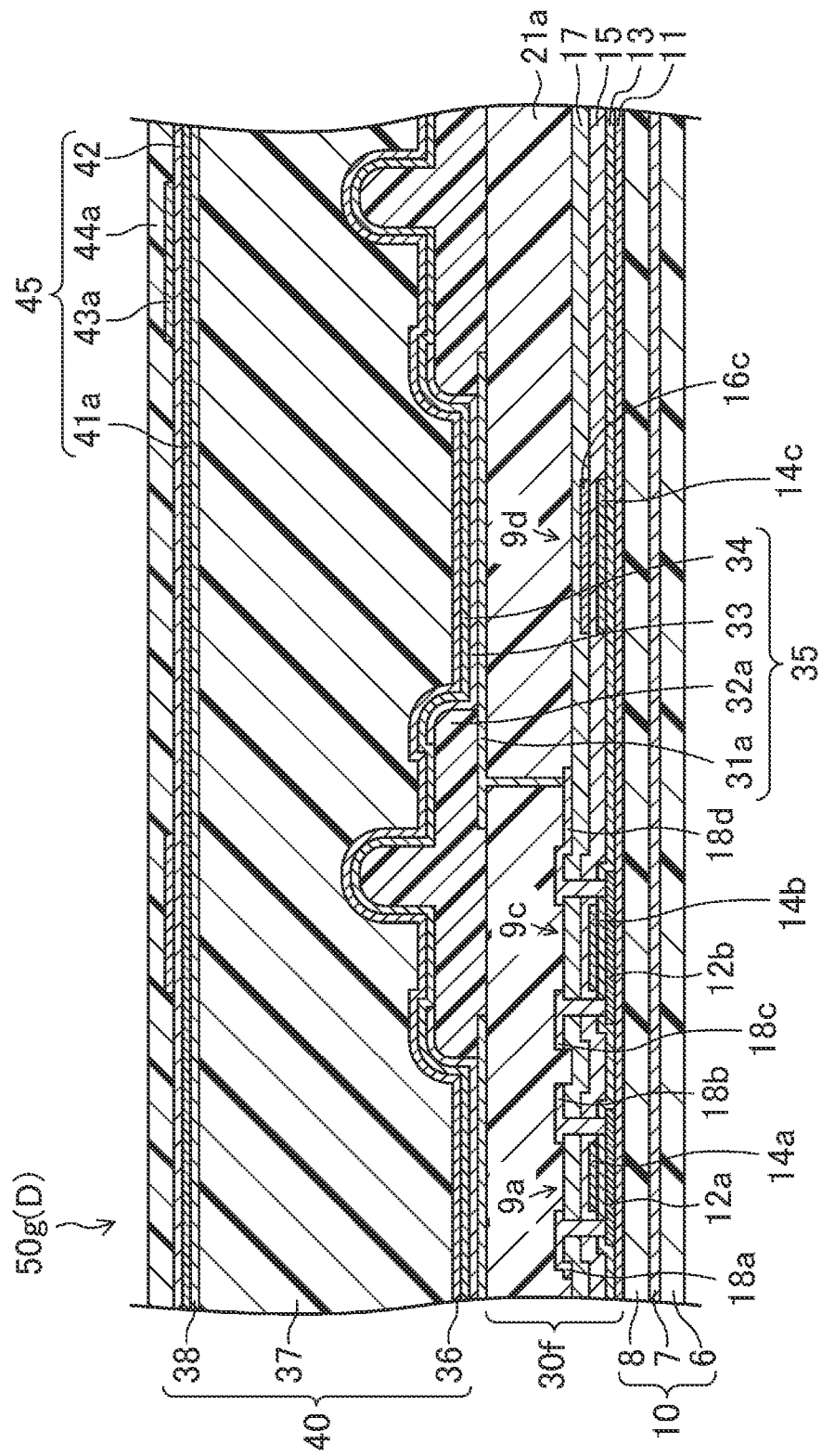
FIG. 17 is a cross-sectional view of a display region of an organic EL display device according to a sixth embodiment of the disclosure.
Figure 18:
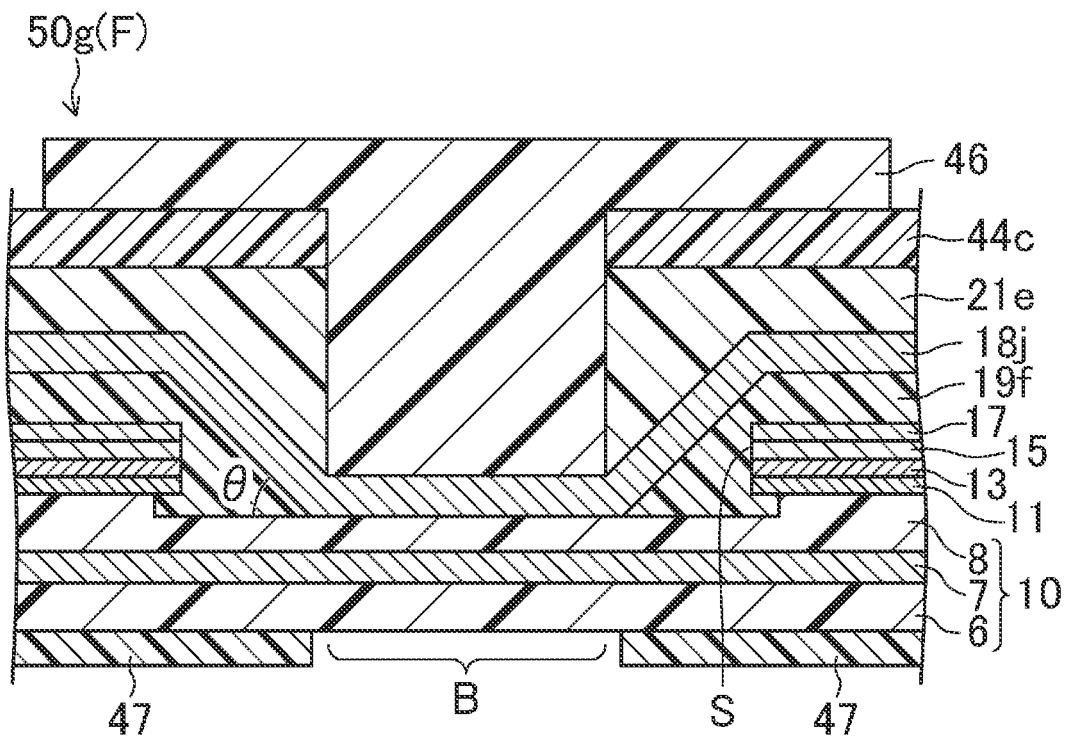
FIG. 18 is a cross-sectional view of a picture-frame region of the organic EL display device according to the sixth embodiment of the disclosure.
Figure 19:
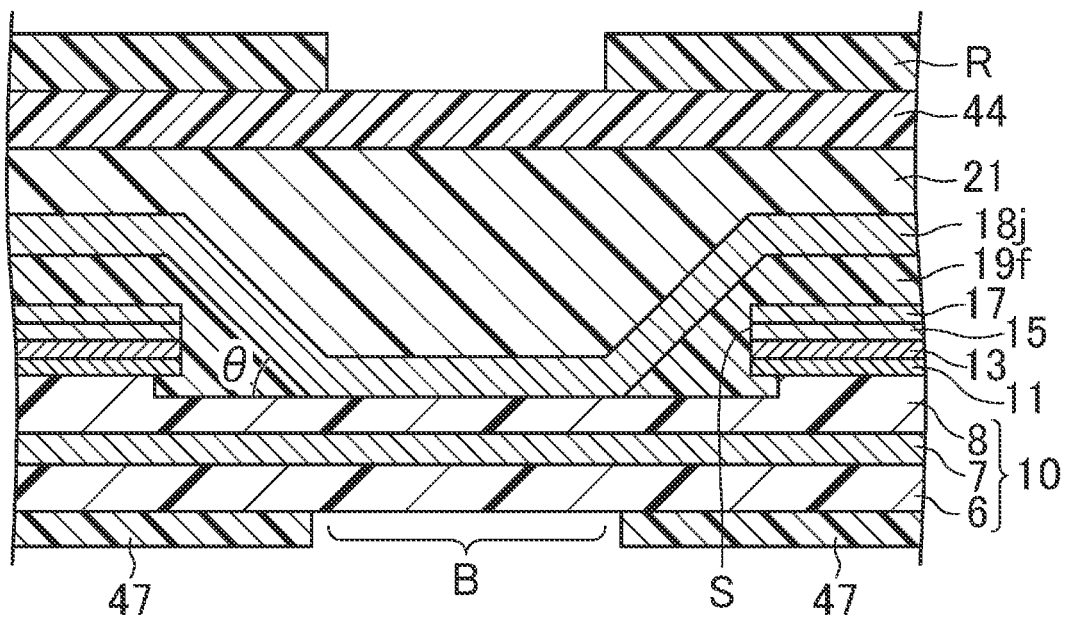
FIG. 19 is a cross-sectional view partially illustrating a step of producing the organic EL display device according to the sixth embodiment of the disclosure.

FIGS. 17 to 19 illustrate a display device according to a fifth embodiment of the disclosure. Here, FIG. 17 is a cross-sectional view of the display region D of an organic EL display device 50f according to this embodiment. FIG. 17 corresponds to FIG. 3. Moreover, FIG. 18 is a cross-sectional view of the picture-frame region F of the organic EL display device 50g. FIG. 18 corresponds to FIG. 7. FIG. 19 is a cross-sectional view partially illustrating a step of producing the organic EL display device 50g. FIG. 19 corresponds to FIG. 7.

The fifth embodiment exemplifies the organic EL display device 50f including the TFT layer 30f without the fourth wiring layer. This embodiment exemplifies the organic EL display device 50g including the TFT layer 30f and the touch panel layer 45.

Similar to the organic EL display device 50a of the first embodiment, the organic EL display device 50g includes the display region D and the picture-frame region F provided around the display region D.

As illustrated in FIG. 17, the organic EL display device 50g includes: the resin substrate layer 10; the TFT layer 30f provided on the resin substrate layer 10; the organic EL element layer provided on the TFT layer 30f; the sealing film 40 provided to cover the organic EL element layer 35; and the touch panel layer 45 provided on the sealing film 40.

Similar to the organic EL display device 50a of the first embodiment, the organic EL display device 50g includes, in the frame region F: the first dam wall Wa shaped into a picture frame and provided out of the trench G to surround the display region D; and the second dam wall Wb shaped into a picture frame and provided around the first dam wall Wa.

Similar to the organic EL display device 50a of the first embodiment, the organic EL display device 50g includes the first picture-frame wire 18h in the picture-frame region F. The first picture-frame wire 18h is shaped into a picture frame, and provided behind the trench G as the third wiring layer. The first picture-frame wire 18h has opposing end portions provided to the opening of the trench G and extending toward the terminal unit T.

Similar to the organic EL display device 50a of the first embodiment, the organic EL display device 50g includes the second picture-frame wire 18i in the picture-frame region F. The second picture-frame wire 18i is shaped into a substantial C-shape and provided out of the trench G as the third wiring layer. The second picture-frame wire 18i has opposing end portions extending toward the terminal unit T.

Similar to the organic EL display device 50a of the first embodiment, the organic EL display device 50g includes the plurality of peripheral photo spacers 32b provided in the picture-frame region F, and each shaped into an island and protruding upwards at opposing edge portions of the trench G.

Similar to the organic EL display device 50a of the first embodiment, as illustrated in FIG. 18, the organic EL display device 50g includes the slit S provided to the folding portion B of the picture-frame region F. The slit S is formed in a multilayer film including the base coat film 11, the gate insulating film 13, the first interlayer insulating film 15, and the second interlayer insulating film 17.

Moreover, as illustrated in FIG. 18, the organic EL display device 50g includes: the plurality of routed wires 18j provided on the first planarization film 19f and the resin substrate layer 10 in the folding portion B and at the opposing sides out of the folding portion B, and extending in parallel with one another in a direction perpendicular to the direction in which the folding portion B extends; a multilayer film provided at the opposing sides out of the folding portion B, and including a protective insulating layer 21e and an overcoat layer 44c sequentially provided to cover the plurality of routed wires 18j; and the reinforcing resin layer 46 provided in the folding portion B to cover the plurality of routed wires 18j. Here, similar to the organic EL display device 50a of the first embodiment, a surface of the organic EL display device 50g toward the first resin substrate layer 6 is provided with the protective sheet 47 except for the folding portion B, as illustrated in FIG. 18. Note that the protective insulating layer 21e is formed of the same material as, and in the same layer as, the second planarization film 21a is. Moreover, the overcoat layer 44c is formed of the same material as, and in the same layer as, the overcoat film 44a is.

Similar to the organic EL display device 50a of the first embodiment, the organic EL display device 50g is flexible. The organic EL display device 50g displays an image when, in each of the subpixels P, the light-emitting layer 3 of the organic EL layer 33 appropriately emits light through the first TFT 9a, the second TFT 9b, and the third TFT 9c. Moreover, as to the organic EL display device 50g, when the surface of the overcoat layer 44a in the display region D is touched, the electrostatic capacity generated at an intersection of the first touch wiring layers 41a and the second touch wiring layers 43a changes. In accordance with the change, the position detecting circuit calculates and detects the touched position.

The organic EL display device 50g of this embodiment can be produced as follows: The TFT layer 30f is formed as seen in the method for producing the organic EL display device 50f of the fifth embodiment. After that, as seen in the method for producing the organic EL display device 50d of the fourth embodiment, at the sealing-film forming step of the production method, the touch-panel forming step is carried out between the step of forming the sealing film 40 and the step of attaching the front-face protective sheet to the substrate surface of the sealing film 40. Thus, the organic EL display device 50g is successfully produced. Here, at the organic-EL-element-layer forming step, when the first electrodes 31a are formed, each of the routed wires 18j is covered with a resin film 21 (see FIG. 19) serving as the protective insulating layer 21e. Such a feature can keep aluminum layers of the respective routed wires 18j from being etched by an etchant to be used in forming the first electrodes 31a. At the touch-panel-layer formation step, on a substrate surface of such layers as the second touch wiring layers 43a, a non-photosensitive transparent acrylic resin film 44 having a thickness of approximately 2.0 μm is formed by, for example, spin coating or slit coating. Then, as illustrated in FIG. 19, a resist pattern R is formed on the acrylic resin film 44. After that, the acrylic resin film 44 and the resin film 21 exposed from the resist pattern R are removed by dry etching, using such a gas as an $SF_6$ gas, a $CF_4$ gas, or an $O_2$ gas. Thus, the protective insulating layer 21e and the overcoat layer 44c are formed.

As described above, as to the organic EL display device 50g of this embodiment, the first planarization film 19f is provided to the opposing sides out of the folding portion B to: fill the widthwise opposing end portions of the slit S formed in the multilayer film including the base coat film 11, the gate insulating film 13, the first interlayer insulating film 15, and the second interlayer insulating film 17; and expose the surface of the resin substrate layer 10 in the intermediate position between the widthwise opposing end portions. As a result, the first planarization film 19f is not substantially found in the folding portion B located in the widthwise intermediate position of the slit S. Hence, even if the organic EL display device 50g is folded at the folding portion B, the first planarization film 19f is less likely to be cracked. Moreover, the plurality of routed wires 18j are formed of the same material as, and in the same layer as, the third wiring layer including the source lines 18f is. In the folding portion B and at the opposing sides out of the folding portion B, the plurality of routed wires 18j are provided on the resin substrate layer 10 and the first planarization film 19f. Such features can reduce the risks of cracks to be formed on the first planarization film 19f and breaks of the routed wires 18j in the folding portion B. Hence, the first planarization film 19f can be less likely to be cracked, and the routed wires 18j can be less likely to be broken in the folding portion B.

Furthermore, as to the organic EL display device 50g of this embodiment, the side surface of the first planarization film 19f toward the folding portion B and the surface of the resin substrate layer 10 form an angle θ of 20° or less. Such a feature can reduce the short-circuit of adjacent routed wires 18j.

Moreover, as to the organic EL display device 50g of this embodiment, the plurality of routed wires 18j are covered with the resin film 21 in forming the first electrodes 31e. Such a feature keeps aluminum layers of the respective routed wires 18j from being etched by an etchant to be used in forming the first electrodes 31a, thereby successfully reducing the risk of thinning the routed wires 18j.

Furthermore, as to the organic EL display device 50g of this embodiment, the slit S, which is formed in the multilayer film including the base coat film 11, the gate insulating film 13, the second interlayer insulating film 15, and the second interlayer insulating film 17, is also provided to the surface layer of the second resin substrate layer 8. Thanks to such a feature, the organic EL display device 50g can be readily folded at the folding portion B.

In addition, as to the organic EL display device 50g of this embodiment, in the folding portion B, there is no layer formed of the same material as, or in the same layer as, the second planarization film 21a is. Thanks to such a feature, even if the organic EL display device 50g is folded at the folding portion B, the second planarization film 21a is less likely to be cracked. Hence, the second planarization film 21a can be less likely to be cracked, and the routed wires 18j can be much less likely to be broken in the folding portion B.

Other Embodiments

In each of the above embodiments, the exemplified organic EL layer includes an organic EL layer of a multilayer structure including five layers such as a hole injection layer, a hole transport layer, a light-emitting layer, an electron transport layer, and an electron injection layer. Alternatively, the organic EL layer may be of a multilayer structure including three layers such as, for example, a hole-injection-and-hole-transport layer, a light-emitting layer, and an electron-transport-and-electron-injection layer.

Moreover, in each of the above embodiments, the exemplified organic EL display device includes a first electrode as an anode and a second electrode as a cathode. The disclosure can also be applied to an organic EL display device whose multilayer structure of the organic EL layer is inverted, and the first electrode is a cathode and the second electrode is an anode.

Furthermore, in each of the above embodiments, the exemplified organic EL display device in which an electrode of a TFT connected to a first electrode is a drain electrode. The disclosure can also be applied to an organic EL display device in which an electrode of a TFT connected to a first electrode is referred to as a source electrode.

In addition, in each of the embodiments, the organic EL display device is exemplified as a display device. The disclosure can be applied to a display device including a plurality of light-emitting elements driven by currents. For example, the disclosure can be applied to a display device including quantum-dot light-emitting diodes (QLEDs); that is, light-emitting elements including layers containing quantum dots.

INDUSTRIAL APPLICABILITY

As described above, the disclosure is useful for a flexible display device.

The invention claimed is:

1. A display device, comprising:
   a resin substrate layer;
   a thin-film transistor layer provided on the resin substrate layer, and including an inorganic insulating film, a first planarization film, a wiring layer, and a second planarization film stacked on top of another in a stated order; and
   a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region,
   wherein the display region is surrounded with a picture-frame region,
   the picture-frame region has an end portion provided with a terminal unit,
   between the display region and the terminal unit, a folding portion is provided to extend in one direction,
   the display region is provided with a plurality of display wires extending in parallel with one another,
   the terminal unit includes a plurality of terminals extending in a direction in which the folding portion extends,
   the inorganic insulating film includes a slit provided to the folding portion, extending in the direction in which the folding portion extends, and exposing a surface of the resin substrate layer,
   the first planarization film is provided to opposing sides out of the folding portion to: fill widthwise opposing end portions of the slit; and expose the surface of the resin substrate layer in an intermediate position between the widthwise opposing end portions, and
   in the folding portion and at the opposing sides out of the folding portion, a plurality of routed wires are provided on the first planarization film and the resin substrate layer, and extending in parallel with one another in a direction perpendicular to the direction in which the folding portion extends, the plurality of routed wires each being electrically connected to a corresponding one of the plurality of display wires toward the display region and to a corresponding one of the plurality of terminals toward the terminal unit, and the plurality of routed wires being formed of a same material as, and in a same layer as, the wiring layer is.

2. The display device according to claim 1, wherein a side surface of the first planarization film toward the folding portion is inclined and forward-tapered.

3. The display device according to claim 2, wherein the side face of the first planarization film toward the folding portion and the surface of the resin substrate layer form an angle of 20° or less.

4. The display device according to claim 1, wherein each of the plurality of routed wires is covered with a corresponding one of a plurality of protective insulating layers formed of a same material as, and in a same layer as, the second planarization film is.

5. The display device according to claim 4, wherein the plurality of protective insulating layers are covered with a reinforcing resin layer in the folding portion and at the opposing sides out of the folding portion.

6. The display device according to claim 1, wherein each of the plurality of routed wires is covered with a corresponding one of a plurality of protective conductive layers formed of a same material as, and in a same layer as, the plurality of first electrodes are.

7. The display device according to claim 6, wherein the plurality of protective conductive layers are covered with a reinforcing resin layer in the folding portion and at the opposing sides out of the folding portion.

8. The display device according to claim 1, wherein the plurality of routed wires are covered with a reinforcing resin layer in the folding portion and at the opposing sides out of the folding portion.

9. The display device according to claim 1, wherein the resin substrate layer includes: a first resin substrate layer provided across from the thin-film transistor layer; a second resin substrate layer provided toward the thin-film transistor layer; and an intra-substrate inorganic insulating film provided between the first resin substrate layer and the second resin substrate layer.

10. The display device according to claim 9, wherein the slit is also provided to a surface layer of the second resin substrate layer.

11. The display device according to claim 10, wherein the inorganic insulating film including the slit has opposing edge portions shaped into eaves and extending inward of a sidewall on the surface layer of the second resin substrate layer.

12. The display device according to claim 11, wherein the first planarization film is provided to fill the eaves, toward the second resin substrate layer, of the opposing edge portions of the inorganic insulating film.

13. A display device, comprising:
    a resin substrate layer;
    a thin-film transistor layer provided on the resin substrate layer, and including an inorganic insulating film, a wiring layer, and a planarization film stacked on top of another in a stated order;
    a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region;
    a sealing film provided to cover the light-emitting element layer, and including a first inorganic sealing film, an organic sealing film, and a second inorganic sealing film stacked on top of another in a stated order; and
    a touch panel layer provided on the sealing film, and including a first touch wiring layer, an interlayer insulating film, a second touch wiring layer stacked on top of another in a stated order,
    wherein the display region is surrounded with a picture-frame region,
    the picture-frame region has an end portion provided with a terminal unit,
    between the display region and the terminal unit, a folding portion is provided to extend in one direction,
    the display region is provided with a plurality of display wires extending in parallel with one another,
    the terminal unit includes a plurality of terminals extending in a direction in which the folding portion extends, the inorganic insulating film includes a slit provided to the folding portion, extending in the direction in which the folding portion extends, and exposing a surface of the resin substrate layer, the planarization film is provided to opposing sides out of the folding portion to: fill widthwise opposing end portions of the slit; and expose the surface of the resin substrate layer in an intermediate position between the widthwise opposing end portions, and in the folding portion and at the opposing sides out of the folding portion, a plurality of routed wires are provided on the planarization film and the resin substrate layer, and extending in parallel with one another in a direction perpendicular to the direction in which the folding portion extends, the plurality of routed wires each being electrically connected to a corresponding one of the plurality of display wires toward the display region and to a corresponding one of the plurality of terminals toward the terminal unit, and the plurality of routed wires being formed of a same material as, and in a same layer as, either the first touch wiring layer or the second touch wiring layer is.

14. The display device according to claim 13, wherein a side surface of the planarization film toward the folding portion is inclined and forward-tapered.

15. The display device according to claim 14, wherein the side face of the planarization film toward the folding portion and the surface of the resin substrate layer form an angle of 20° or less.

16. The display device according to claim 13, wherein the plurality of routed wires are covered with a reinforcing resin layer in the folding portion and at the opposing sides out of the folding portion.

17. The display device according to claim 13, wherein the touch panel layer includes an overcoat film stacked on the second touch wiring layer, and the plurality of routed wires are covered with an overcoat layer in the folding portion and at the opposing sides out of the folding portion, the overcoat layer being formed of a same material as, and in a same layer as, the overcoat film is.

18. A display device, comprising:

a resin substrate layer;

a thin-film transistor layer provided on the resin substrate layer, and including an inorganic insulating film, a wiring layer, and a planarization film stacked on top of another in a stated order; and a light-emitting element layer provided on the thin-film transistor layer, and including a plurality of first electrodes, a plurality of light-emitting functional layers, and a common second electrode stacked on top of another in a stated order and corresponding to a plurality of subpixels included in a display region, wherein the display region is surrounded with a picture-frame region, the picture-frame region has an end portion provided with a terminal unit, between the display region and the terminal unit, a folding portion is provided to extend in one direction, the display region is provided with a plurality of display wires extending in parallel with one another, the terminal unit includes a plurality of terminals extending in a direction in which the folding portion extends, the inorganic insulating film includes a slit provided to the folding portion, extending in the direction in which the folding portion extends, and exposing a surface of the resin substrate layer, an other planarization film is provided to opposing sides out of the folding portion to: fill widthwise opposing end portions of the slit; and expose the surface of the resin substrate layer in an intermediate position between the widthwise opposing end portions, and in the folding portion and at the opposing sides out of the folding portion, a plurality of routed wires are provided on the other planarization film and the resin substrate layer, and extending in parallel with one another in a direction perpendicular to the direction in which the folding portion extends, the plurality of routed wires each being electrically connected to a corresponding one of the plurality of display wires toward the display region and to a corresponding one of the plurality of terminals toward the terminal unit, and the plurality of routed wires being formed of a same material as, and in a same layer as, the wiring layer is.

19. The display device according to claim 18, wherein a side surface of the other planarization film toward the folding portion is inclined and forward-tapered.

20. The display device according to claim 19, wherein the side face of the other planarization film toward the folding portion and the surface of the resin substrate layer form an angle of 20° or less.

* * * * *